United States Patent [19]

Keeley et al.

[11] Patent Number: 4,686,621
[45] Date of Patent: Aug. 11, 1987

[54] TEST APPARATUS FOR TESTING A MULTILEVEL CACHE SYSTEM WITH GRACEFUL DEGRADATION CAPABILITY

[75] Inventors: James W. Keeley, Hudson; Robert V. Ledoux, Litchfield, both of N.H.; Virendra S. Negi, Pepperell, Mass.

[73] Assignee: Honeywell Information Systems Inc., Waltham, Mass.

[21] Appl. No.: 510,079

[22] Filed: Jun. 30, 1983

[51] Int. Cl.⁴ .................. G06F 11/00; G11C 7/00; G11C 29/00
[52] U.S. Cl. ............................. 364/200; 371/21
[58] Field of Search ... 364/200 MS File, 900 MS File; 371/16, 21, 49, 10-11

[56] References Cited

U.S. PATENT DOCUMENTS

| | | | |
|---|---|---|---|
| 4,051,460 | 9/1977 | Yamapa et al. | 371/10 |
| 4,084,231 | 4/1978 | Capozzi et al. | 364/200 |
| 4,392,201 | 7/1983 | Brown et al. | 364/200 |
| 4,394,733 | 7/1983 | Swenson et al. | 364/200 |
| 4,464,717 | 8/1984 | Keeley et al. | 364/200 |
| 4,525,780 | 6/1985 | Bratt et al. | 364/200 |

OTHER PUBLICATIONS

C. L. Chen et al, "*Error Migration Protection for Multi-processor with Hierarchial Memory*", (IBM Tech. Disclos. Bull., vol. 20, No. 9), pp. 3579-3580.

E. J. Annunziata et al, "*Cache Error Handling in a Store-in-Cache Design*, E. J. Annunziata et al, (IBM Tech. Disclos. Bull., vol. 20, No. 9), pp. 3585-3586.

E. J. Annunziata et al, "*Cache Purge in Store-in-Cache System*", (IBM Technical Disclosure Bulletin, vol. 20, No. 9), p. 3587.

*Primary Examiner*—Archie E. Williams, Jr.
*Assistant Examiner*—Lawrence E. Anderson
*Attorney, Agent, or Firm*—Faith F. Driscoll; John S. Solakian

[57] ABSTRACT

A multilevel set associative cache system whose directory and cache store are organized into levels of memory locations includes control apparatus which selectively degrades cache operation in response to error signals from directory error checking circuits to those levels detected to be free from errors. Test apparatus coupled to the control apparatus and operates to selectively alter the operational states of the cache levels in response to commands received from a central processing unit for enabling testing of such control apparatus in addition to the other cache control areas.

29 Claims, 11 Drawing Figures

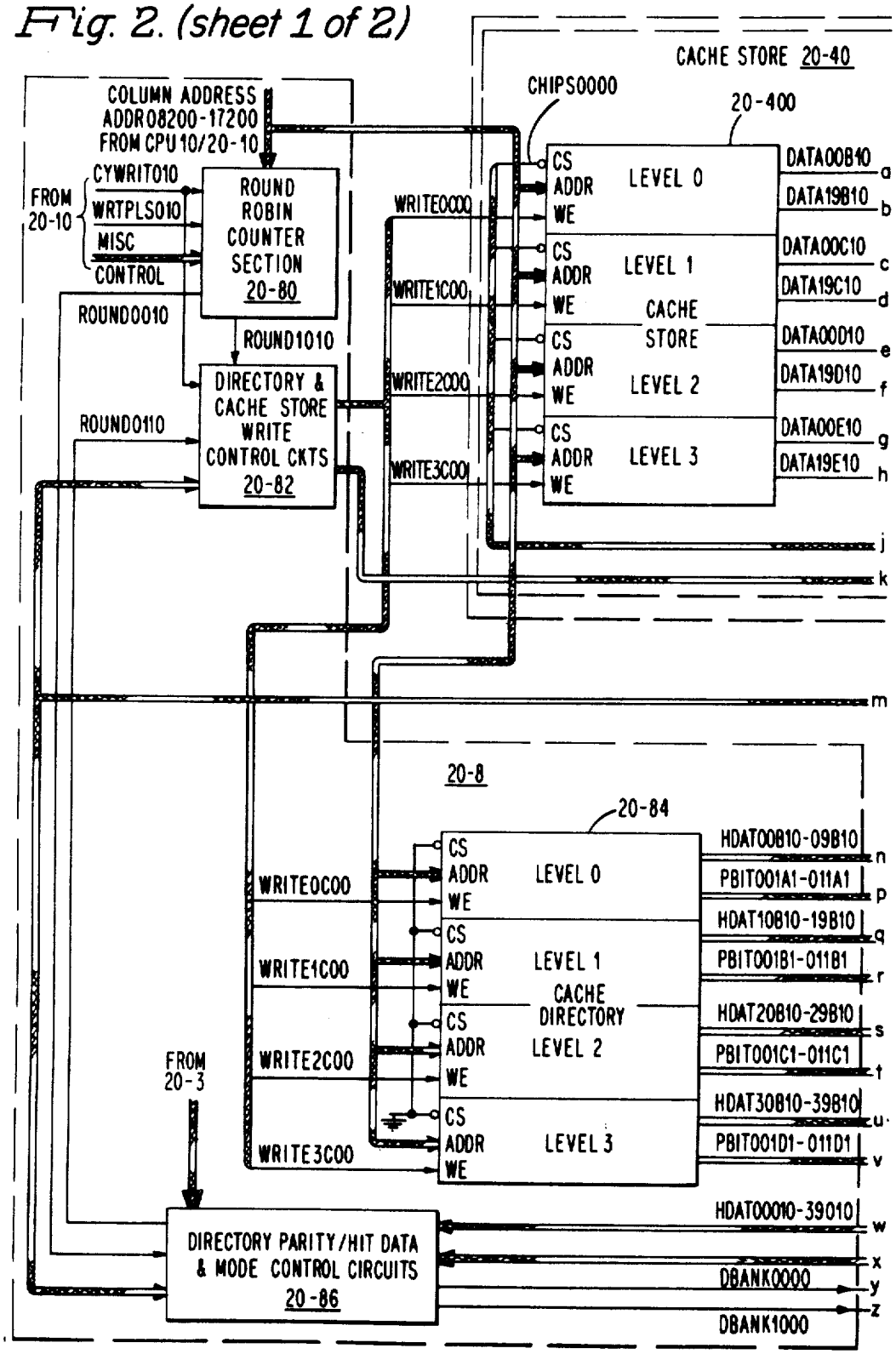

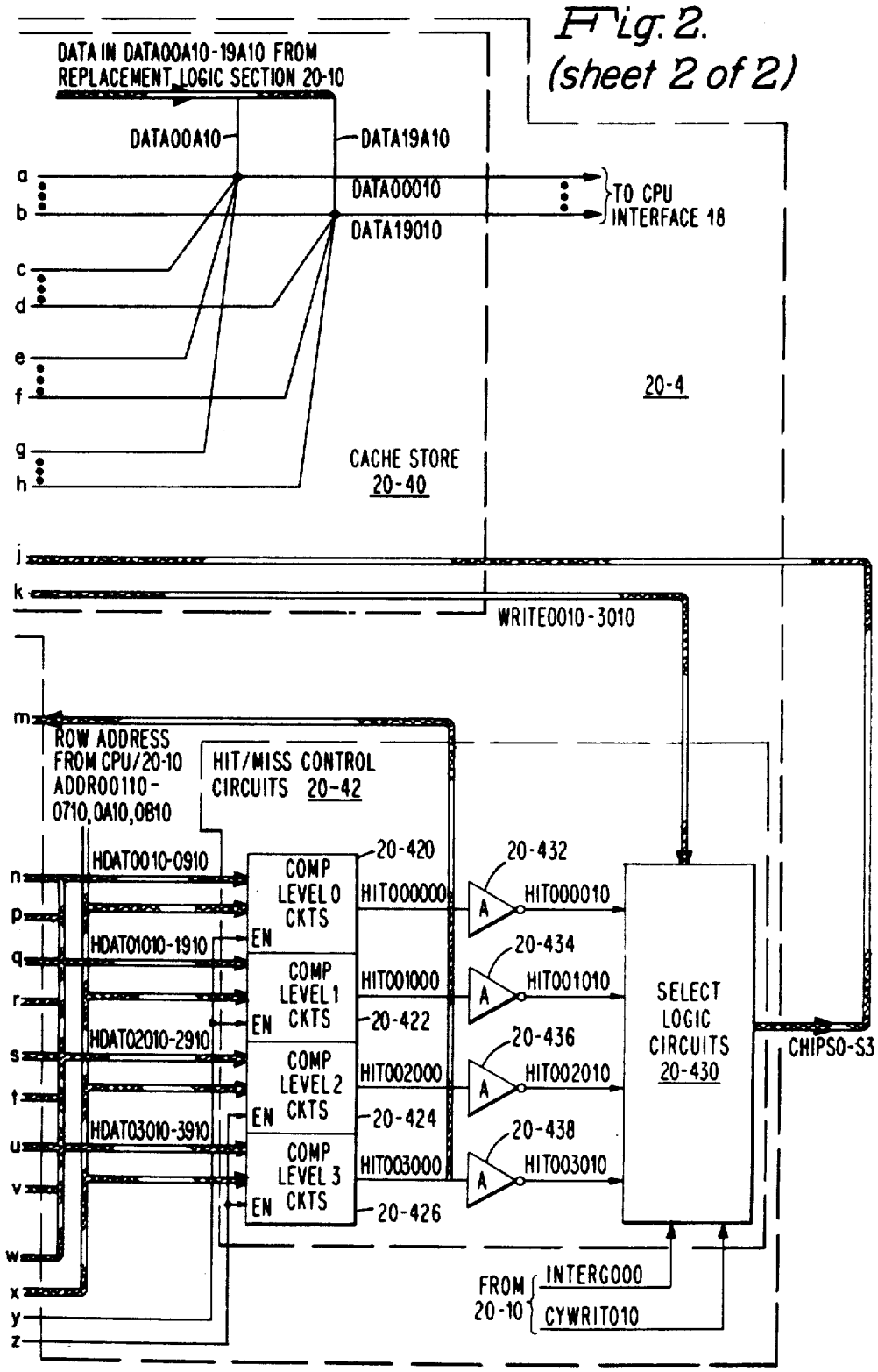
Fig. 2. (sheet 2 of 2)

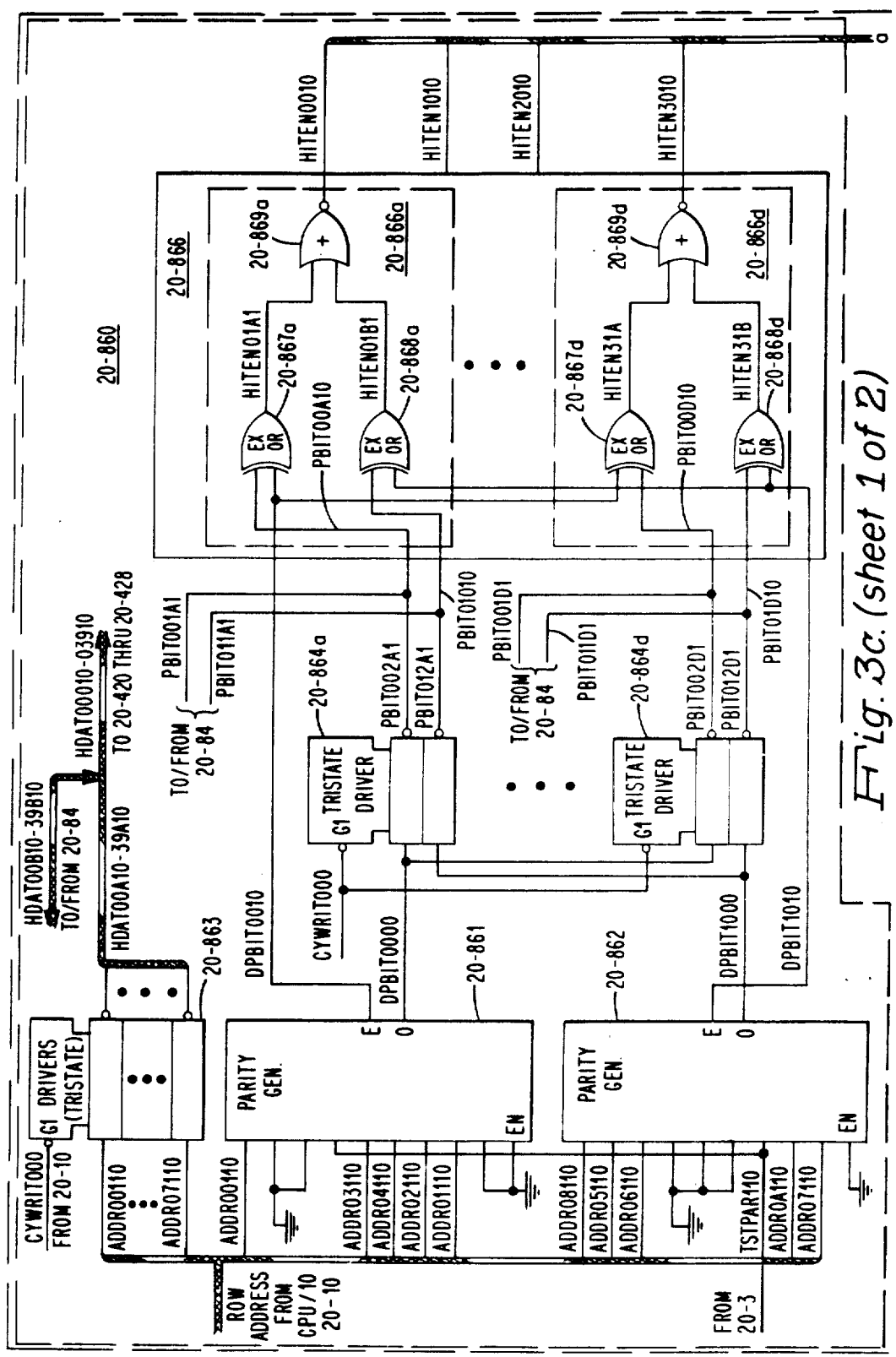
Fig. 3c. (sheet 1 of 2)

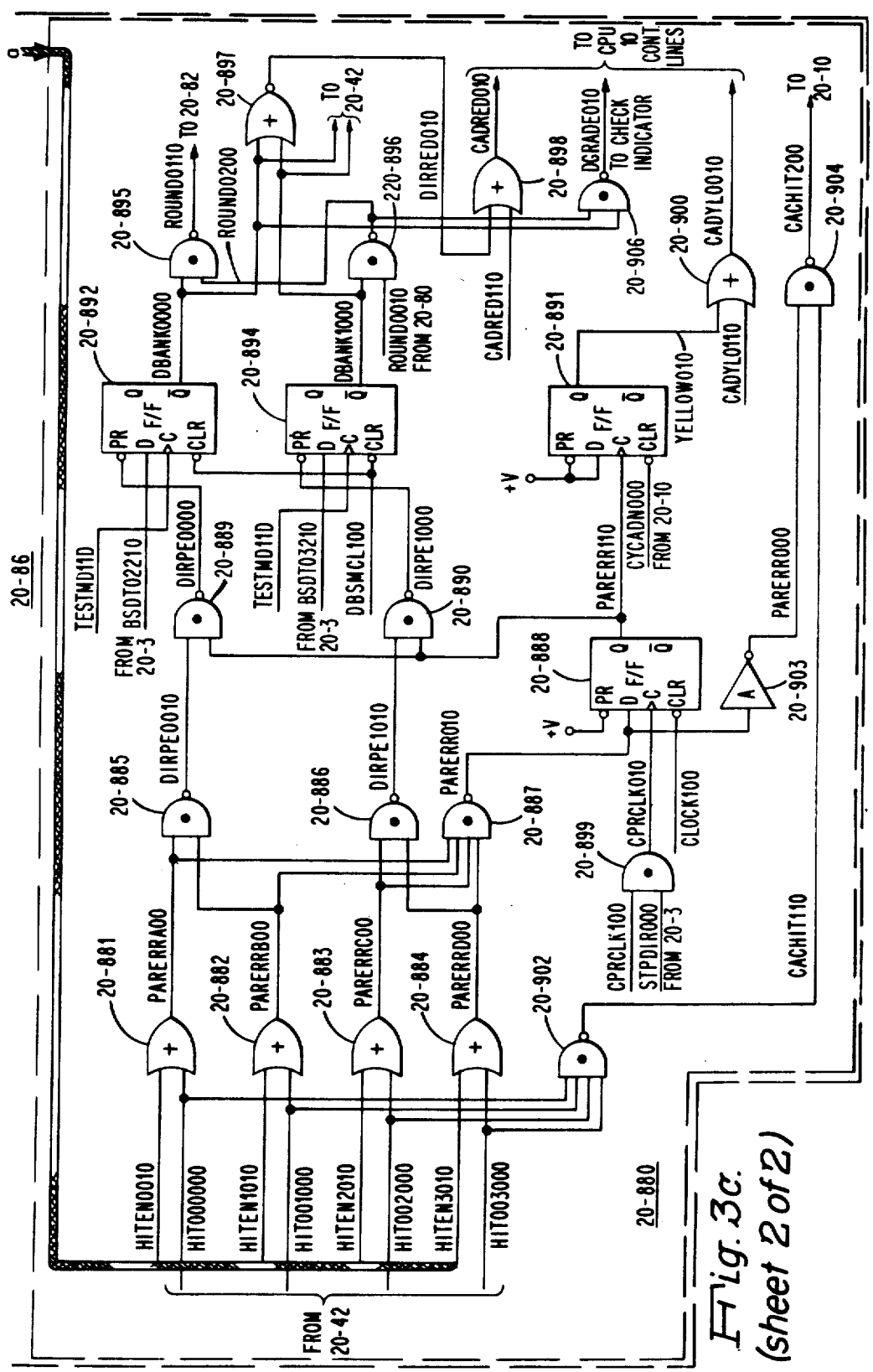
Fig. 3c. (sheet 2 of 2)

4,686,621

TEST APPARATUS FOR TESTING A MULTILEVEL CACHE SYSTEM WITH GRACEFUL DEGRADATION CAPABILITY

RELATED APPLICATIONS

1. "Multilevel Cache System with Graceful Degradation Capability", invented by James W. Keeley, Edwin P. Fisher and John L. Curley, Ser. No. 06/364,052, filed on Mar. 31, 1982, which issued as U.S. Pat. No. 4,464,717 on Aug. 7, 1984 and is assigned to the same assignee as named herein.

2. "Shared Interface Apparatus for Testing the Memory Sections of a Cache Unit", invented by James W. Keeley, Ser. No. 06/364,051, filed on Mar. 31, 1982, which issued as U.S. Pat. No. 4,575,792 on Mar. 11, 1986 and is assigned to the same assignee as named herein.

3. "Directory Test Error Mode Control Apparatus", invented by James W. Keeley, Robert V. Ledoux and Virendra S. Negi, Ser. No. 06/509,825, filed on June 30, 1986, which issued as U.S. Pat. No. 4,562,536 on Dec. 31, 1985 and is assigned to the same assignee as named herein.

4. "Enable/Disable Control Checking Apparatus", invented by James W. Keeley, Robert V. Ledoux and Virendra S. Negi, Ser. No. 06/509,898, filed on June 30, 1983 which is assigned to the same assignee as named herein.

BACKGROUND OF THE INVENTION

1. Field of Use

The present invention relates to the testing of data processing systems and more particularly to the testing of cache systems.

2. Prior Art

It is well known in the art to provide cache units between a central processing unit (CPU) and a main store to improve overall system performance. However, since the cache unit is normally invisible to the operating system software during normal operation, errors or faults occurring within the cache unit are not detectable by such software. That is, when the cache is unable to provide correct data in response to a CPU request, the cache unit fetches the data from main store. This results in decreased system performance.

In view of the above, it becomes difficult to diagnose whether or not the cache unit is operating properly. In the past elaborate software diagnostic routines were employed for testing cache operation which involved transferring information from main store to cache for comparison with such known information when read from cache.

In order to eliminate the need for such elaborate software, one system arrangement enables the cache unit to be placed in a test and verification mode of operation wherein hardware faults can be signalled to the CPU. This arrangement is described in U.S. Pat. No. 4,190,885, issued Feb. 26, 1980, and is assigned to the same assignee as named herein. In greater detail, this system employs test and verification apparatus which responds to certain commands which enable the cache system to signal when the data requested from cache is not stored in cache after the cache has been initialized. This enables the test and diagnostic apparatus to test the directory and associated logic circuits. In this type of system, the cache is bypassed upon the detection of fault conditions by the CPU.

To improve the reliability of such cache systems, the cache system of the first related patent application includes control apparatus which couples to round robin replacement apparatus which is used to identify the cache level into which information is to be written. The control apparatus combines error signals from error checking circuits with signals indicative of cache hits to produce invalid hit signals. These signals condition the replacement apparatus, in addition to other portions of the cache system, to degrade cache operation to those levels detected as being free from errors. While the cache arrangement improves system reliability and performance, it makes diagnosis of faults more difficult.

The second related patent application discloses a cache unit which includes test mode logic circuits for enabling the cache memory section without controller interference. While the arrangement permits direct testing of the cache memory, it does not enable testing of the controller cache sections. Also, since the arrangement has particular application in factory test environment, it cannot be easily adapted for use with standard test and verification procedures carried out under the control of the system's central processing unit.

Accordingly, it is a primary object of the present invention to provide testing apparatus which facilitates the detection of faults within a cache unit during test and verification operations.

It is a further object of the present invention to provide testing apparatus which facilitates the detection of faults within the controller portions of a cache unit.

It is still a further object of the present invention to provide apparatus for testing the control circuits of a multilevel cache unit which is automatically degradable.

SUMMARY OF THE INVENTION

The above objects and advantages are achieved in a preferred embodiment of the multilevel set associative cache system which includes the test active levels mode apparatus and method of the present invention. The cache system is positioned between a central processing unit (CPU) and main memory. The directory and cache stores are organized into a number of levels of memory locations which are automatically degradable.

That is, directory store checking circuits upon detecting errors in the directory store addresses during cache read and write cycles of operation condition control circuits which degrade cache operations to those levels detected to be free from errors.

The test mode apparatus couples to the control circuits and operates to selectively alter the operational states of the cache levels in response to commands received from the central processing unit (CPU) which couples to the cache system. By controlling the active levels of the cache system, the test mode apparatus and method permits test software routines to verify cache operation when automatic degradation occurs upon the detection of cache directory errors.

Additionally, the test active levels mode apparatus permits test software routines to control which memory cycles are directed to cache system enabling control of cache information content.

In greater detail, the test active levels mode apparatus and method enables the establishment of a plurality of modes. When placed in a first mode, the cache system operates so that all levels are active characteristic of normal operation. A first set of levels and a second set of levels can be selectively placed in an active state when the cache system is placed in second and third modes of operation. This enables the test software routines to verify the operation of the system's initialization replacement and update circuits, in addition to the hit logic circuits when the system is operated in partially degraded modes of operation. When placed in a fourth mode, all levels are placed in inactive states, which enables verification of the data path from the bus interface which the cache system couples around the cache memory section to main memory.

The test software by utilizing "no hit fault mode" apparatus included as part of the test apparatus conditioned by other commands, prevents cache replacement, update and read hit cycles of operation. This permits reading or writing of main memory directly without cache involvement. This allows the contents of cache and associated main memory locations to be made different enabling the test software to determine whether the source of data is the cache system or main memory for verifying the operation of different parts of the cache system.

In addition to using the test mode apparatus and method of the present invention during testing operations, the same apparatus can be used by the system operating software for further investigating the state of the cache system when an error condition has been reported. In such cases, the cache system need not be initialized to a known state.

The novel features which are believed to be characteristic of the invention, both as to its organization and method of operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

BRIEF DESCRIPTION OF THE DRAWINGS

FIG. 2 is a block diagram of the cache unit of FIG. 1.

FIG. 3c shows the directory parity and mode control circuits of the cache unit of FIG. 1.

DESCRIPTION OF THE PREFERRED EMBODIMENT

Figure 1:
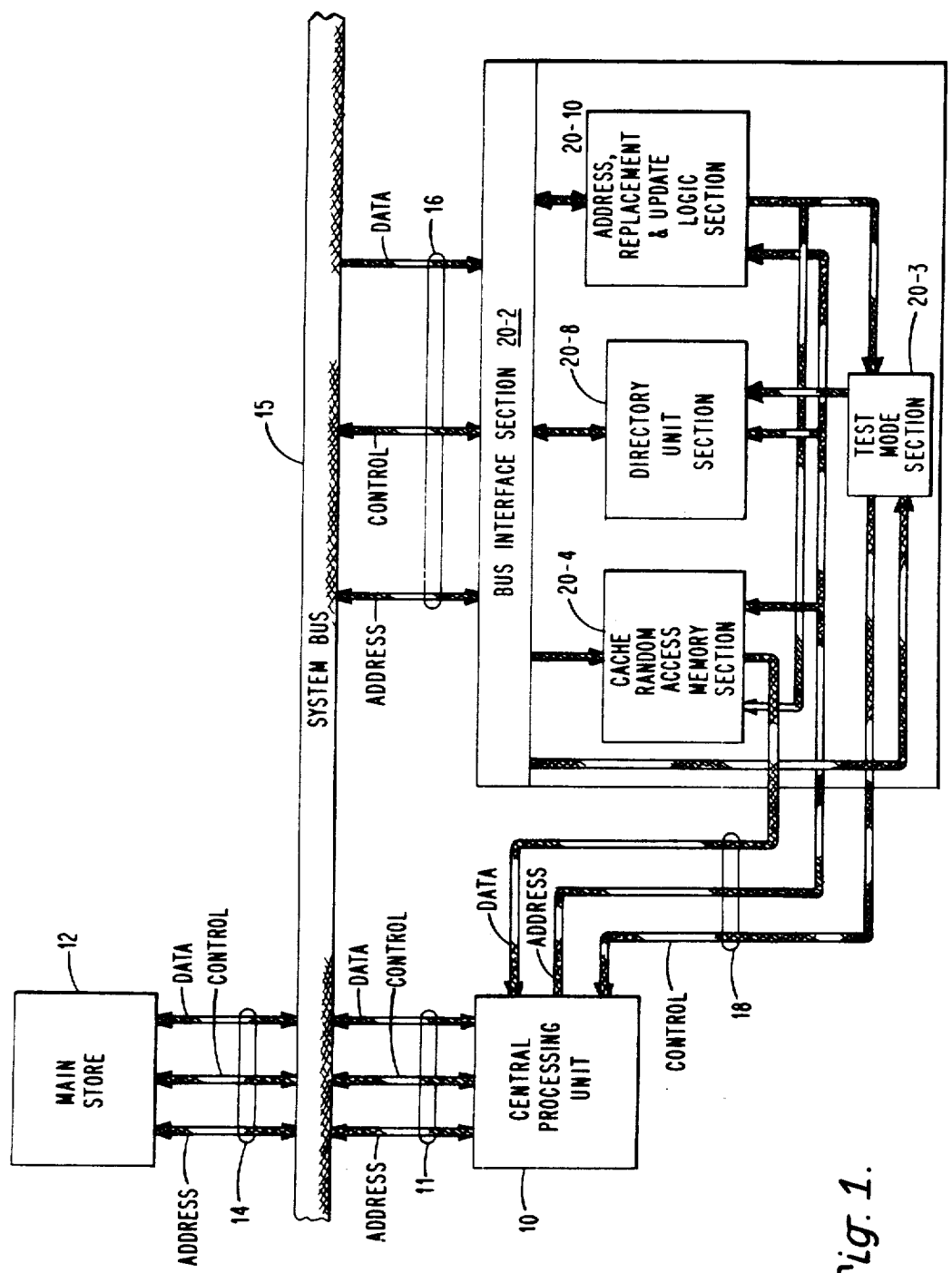
FIG. 1 is a block diagram of a minicomputer system including a cache unit which includes the test mode apparatus of the present invention.

Referring to FIG. 1, it is seen that the minicomputer system includes a central processing unit (CPU) 10, a main store 12 and a cache unit 20. As shown, the CPU 10, main store 12 and cache unit 20 couple to a system bus 15 via address control and data lines of bus interfaces 11, 14 and 16, respectively. Additionally, CPU 10 and cache unit 20 are interconnected through the address, control and data lines of a private interface 18.

For the purposes of the present invention, CPU 10 and main store 12 may be considered conventional in design. Main store 12 is a MOS memory which can include up to 1,048,576 words organized in 1,024 rows by 1,024 columns. For example, CPU 10 and main store 12 may take the form of the CPU and main memory described in U.S. Pat. No. 4,195,343 issued Mar. 25, 1980, assigned to the assignee named herein. Also, they may take the form of the units included in the Series 60 Level 6 Model 53 minicomputer manufactured by Honeywell Information Systems Inc.

The cache unit 20 provides high speed access to processor data and instructions which have been previously used or are expected to be used (e.g. prefetched). In general, CPU 10 requests data words and instructions via private interface 18. When the requested word is in cache, the cache unit 20 transfers the requested word over the interface 18. When the requested word is not stored in cache, cache unit 20 fetches the word from main store 12 and transfers it to CPU 10 via private interface 18.

The cache unit 20 of the preferred embodiment includes a bus interface section 20-2, a directory section 20-8, a cache random access memory (RAM) section 20-4 and a replacement logic section 20-10 and a test mode section 20-3. The bus interface section 20-2 includes the bus control circuits for enabling the cache unit 20 to access main store 12 through asynchronous system bus 15 for fetching data and instructions in response to requests from CPU 10. For further information regarding a number of these circuits and the operation of system bus 15, reference may be made to U.S. Pat. Nos. 3,993,981, 4,030,075 and 4,195,343.

The directory section 20-8 determines whether or not the CPU requested word resides in Section 20-4. To accomplish this, the directory section 20-8 as discussed herein includes a 4-level set associative memory. Also, it operates to generate invalid hit detection signals in response to error signals used for placing the cache unit 20 in a degraded mode of operation.

The cache RAM section 20-4 includes the high speed storage for CPU data and instructions. It has 4096 words of storage which are organized into four by 1,024 columns of storage. Accordingly, each column of main store 12 has four entries in cache section 20-4 associated therewith.

The replacement logic section 20-10 includes the circuits which control access to main store 12 for fetching data or instructions requested by CPU 10 which were not found in cache RAM section 20-4. Also, it includes logic circuits for storing information received from main store 12 in both the cache RAM section 20-4 and directory section 20-8 during replacement and update operations.

The test mode section 20-3 includes the circuits which, in response to commands from CPU 10, operate to condition other portions of cache unit 20 to enable test and verification operations to be performed under the control of test software routines resident within section 20-4.

Cache RAM Section 20-4

FIG. 2 illustrates in block diagram form, the units which comprise sections 20-4 and 20-8. As seen from the Figure, section 20-4 includes the 4-level cache store 20-40 and hit/miss control circuits 20-42. Each level of store 20-40 includes six RAM chips, each chip containing 1024 by 4-bit locations. As seen from FIG. 2, each RAM chip receives column address signals ADDR08200 through ADDR17200 from replacement logic section 20-10. These signals correspond to the least significant 10 address bits of the main store address received from CPU 10 (e.g. bits 10–19). Additionally, the six chips of each level receive a corresponding one of the chip select signals CHIPS0000 through CHIPS3000 from the circuits of block 20-42. When any one of these signals is forced to a binary ZERO, all of the RAM chips of the designated level are enabled for operation.

The RAM levels may be considered conventional in design and may, for example, be constructed from 2149H MOS memory chips manufactured by Intel Corporation.

Lastly, the RAM chips of each level receive a corresponding one of the write enable signals WRITE0C00 through WRITE3C00 from directory section 20-8. When any one of these signals is forced to a binary ZERO, all of the chips of the designated level are enabled for a write operation. The data to be written into the designated level is applied to a set of data in lines as signals DATA00A10 through DATA19A10 which are received from section 20-10. Also, data is read out from the chips of each level to a set of output lines as signals DATA00010 through DATA19010. The input and output data lines common to each level are connected in a wired OR arrangement as shown in FIG. 2.

As seen from FIG. 2, the hit/miss control circuits of block 20-42 include four comparator circuits 20-420 through 20-426. These circuits compare the row address signals ADDR0010 through ADDR0710, signals ADDR00A10 and ADDR00B10 from CPU 10 or replacement logic section 20-10 with the address signals read out from a corresponding one of the directory levels (i.e., signals HDAT00B10-09B10, HDAT10B10-19B10, HDAT20B10-29B10 and HDAT30B10-39B10). The row address corresponds to the most significant 10 bits of the main store address (i.e., bits 0–9).

Each of the comparator circuits 20-420 through 20-426 generates a corresponding one of the hit signals HIT000000 through HIT003000 indicative of the results of the comparison. The hit signals are applied as inputs to directory section 20-8 and to the select logic circuits of block 20-430. When there is a true or identical comparison, the comparator circuit forces a corresponding one of the hit signals to a binary ZERO.

The comparator circuits are conventional in design. For example, each comparator circuit may be constructed from 10 exclusive OR circuits connected to compare each pair of corresponding address bits and a NAND gate connected to receive the outputs of the exclusive OR circuits. Additionally, the NAND gate is connected to receive one of the pairs of signals DBANK0000 and DBANK1000 from directory section 20-8. As explained herein, the states of these signals establish whether or not cache unit 20 is being operated in a degraded mode of operation.

As seen from FIG. 2, signals HIT000000 through HIT003000 are inverted by inverter circuits 20-432 through 20-438 and the output signals HIT000010 through HIT003010 are applied as inputs to the logic circuits of block 20-430. These circuits operate to generate chip enable signals CHIPS0000 through CHIPS3000. These signals are generated in accordance with the following Boolean equations wherein the symbol + represents an OR operation and the symbol · represents an AND operation.

CHIPS0000 = HIT000010·INTERG000 + ·
WRITE0010·CYWRIT010

CHIPS1000 = HIT001010·INTERG000 + ·
WRITE1010·CYWRIT010

CHIPS2000 = HIT002010·INTERG000 + ·
WRITE2010·CYWRIT010

CHIPS3000 = HIT003010·INTERG000 + ·
WRITE3010·CYWRIT010.

The signals INTERG000 and CYWRIT010 are timing signals generated by the circuits of replacement logic section 20-10.

Signal INTERG000 is a binary ZERO when data is not being applied to bus interface 18 from cache store 20-40. Signal CYWRIT010 is forced to a binary ONE during each memory write cycle of operation. For further information regarding the operation of these signals, reference may be made to U.S. Pat. No. 4,195,343.

Directory Section 20-8

As seen from FIG. 2, section 20-8 includes the round robin counter circuits of block 20-80, the directory and cache store write control circuits of block 20-82, the four-level set associative directory 20-84 and the directory parity and mode control circuits of block 20-86. The round robin counter circuits of block 20-80 select the next column of cache store 20-400 whose information is to be replaced with new information. The round robin replacement technique employed replaces the least recently replaced location with new information.

Briefly, each cache column is managed independently in that the circuits of block 20-80 ascertain which of the four entries of the column is to be allocated a word from a corresponding main memory column. The allocation is carried out by employing a separate counter for each column whose contents point to the next word location in the cache column to be assigned or allocated. As each new word is stored in cache, the counter associated with the cache column is incremented by one in a wrap-around fashion so that the fifth in a series of new memory references to the same column replaces the information of first memory reference. Thus, the contents of a cache word location that is the least recently replaced in a column is replaced by information from a memory reference to a word in the corresponding memory column that is not already in cache.

Round Robin Counter Section 20-80

Figure 3A:
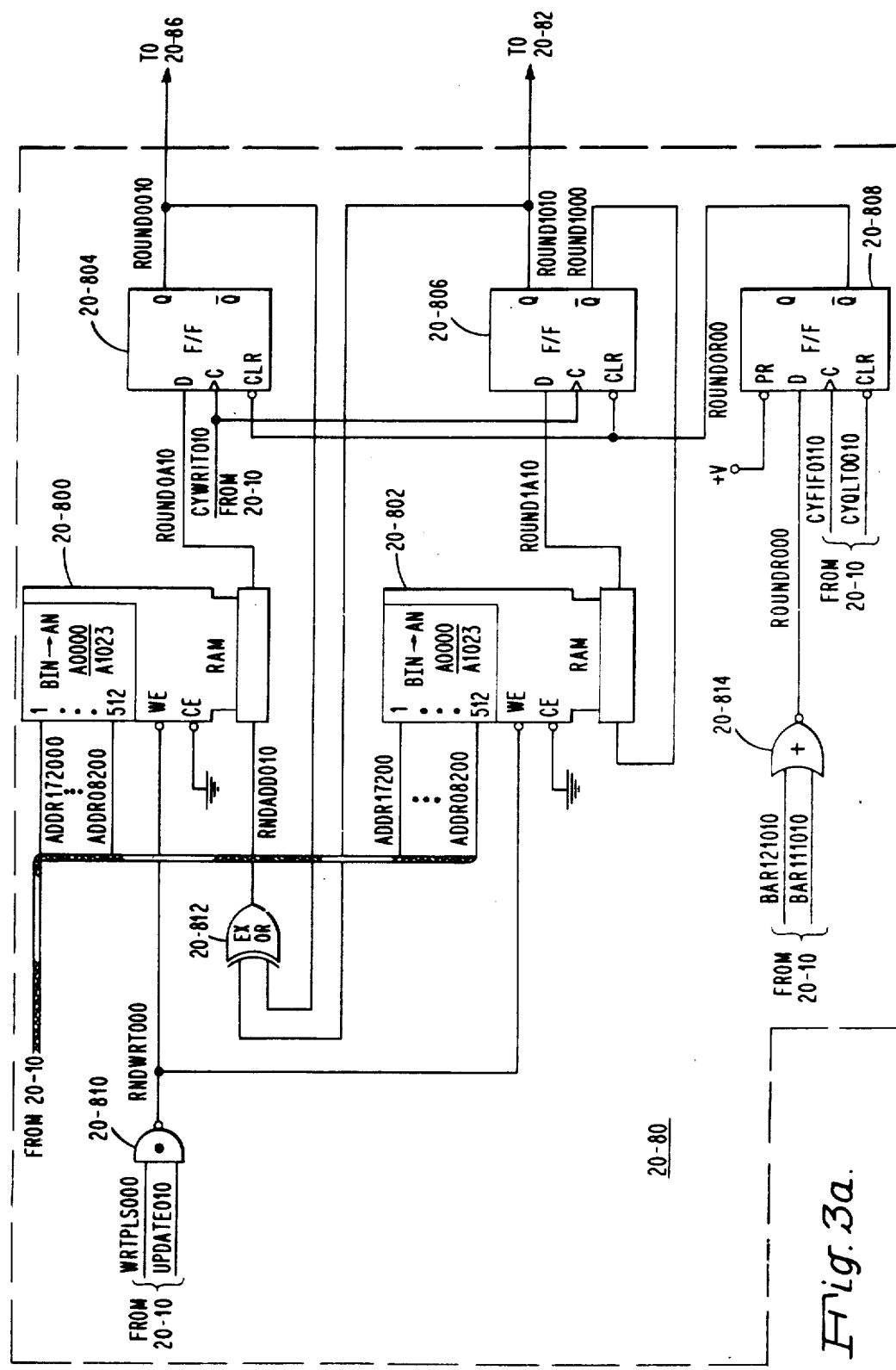
FIG. 3a shows the round robin counter circuits of the cache unit of FIG. 1.

As seen in FIG. 3a, the round robin counter circuits of block 20-80 include a pair of 1-bit × 1024 RAM chips 20-800 and 20-802, a plurality of D-type flip-flops 20-804 through 20-808, a NAND gate 20-810, an exclusive OR gate 20-812 and a NOR gate 20-814 connected as shown. The chip enable terminals (CE) of RAM chips 20-800 and 20-802 connect to ground which enable the chips for a read or write cycle of operation. The RAM chips 20-800 and 20-802 in response to column address signals ADDR08200 through ADDR17200 applied to the chips' address input terminals by section 20-10 generate output signals ROUNDOA10 and ROUND1A10 which specify the cache column storing the least recently replaced information.

The write enable terminals (WE) of RAM chips 20-800 and 20-802 are enabled for a write cycle of operation as a function of signal RNDWRT000 from NAND gate 20-810. When write signal WRTPLS000 generated from delaying signal CYWRIT010 and signal UPDATE010 are both binary ONES, NAND gate 20-810 forces signal RNDWRT000 to a binary ZERO enabling RAM chips 20-800 and 20-802 for a write cycle of operation.

Write cycles of operation are generated during a quality logic test (QLT) mode of operation wherein the first 4096 data words stored in main store 12 are written into cache. During the QLT mode, signal CYQLT0010 is a binary ONE enabling flip-flop 20-808 to switch state as a function of signal ROUNDR000.

When both signals BAR012010 and BAR111010 are binary ZEROS, NOR gate 20-814 forces signal ROUNDR000 to a binary ONE. When cycle timing signal CYF1F0110 switched to a binary ONE, signal ROUNDR000 switches flip-flop 20-808 to a binary ONE. This in turn forces the binary ZERO output signal ROUNDOR00 to a binary ZERO.

Signal ROUNDOR00 when a binary ZERO generates a clear signal which holds flip-flops 20-804 and 20-806 in their binary ZERO states. The binary ZERO states of signals ROUND0010 and ROUND1010 cause exclusive OR gate 20-812 to force signal RNDADD010 to a binary ZERO. Accordingly, a binary ZERO is applied to the data input terminal of RAM chip 20-800. At the same time, since flip-flop 20-806 is in a binary ZERO state, signal ROUND1000 is a binary ONE. Therefore, a binary ONE is applied to the data input terminal of RAM chip 20-802.

During a first addressing sequence, signal CYWRIT010 is forced to a binary ONE during each of the 1024 write cycles which in turn forces write pulse enable signal WRTPLS000 to a binary ONE. Since signal UPDATE010 is a binary ONE during QLT mode, NAND gate 20-810 forces signal RNDWRT000 to a binary ZERO enabling both RAM chips 20-800 and 20-802 for a write cycle of operation. During the write cycle, a binary ZERO is written into a bit location of RAM chip 20-800 while a binary ONE is written into a bit location of RAM chip 20-802.

Binary ZEROS are successively written into the 1024 bit locations of RAM chip 20-800 corresponding to addresses 0000-1023 while binary ONES are successively written into the 1024 bit locations of RAM chip 20-802 having the same corresponding addresses. During the first addressing sequence, the binary ZERO outputs from flip-flops 20-804 and 20-806 are applied to other portions of the cache, enabling the cache and directory locations of level 0 to be written.

When the address 1024 hexidecimal "400" is reached signalling the end of the first sequence, signal BAR12010 is forced to a binary ONE. This causes NOR gate 20-814 to force signal ROUNDR000 to a binary ZERO. When cycle timing signal CYF1F0110 switches to a binary ONE, flip-flop 20-808 switches to a binary ZERO. At this time, flip-flops 20-804 and 20-806 are enabled for switching. Again, hexidecimal address "0000" is applied to RAM chips 20-800 and 20-802. Signal ROUNDOA10 read from RAM chip 20-800 is a binary ZERO while signal ROUND1A10 read from RAM chip 20-802 is a binary ONE. When signal CYWRIT010 switches to a binary ONE, flip-flop 20-806 switches to a binary ONE state. This causes exclusive OR circuit 20-812 to switched signal RNDADD010 to a binary ONE. Accordingly, a binary ONE signal is applied to the data input of RAM chip 20-800 while a binary ZERO signal is applied to the data input of RAM chip 20-802. Accordingly, a binary ONE is written into the first bit location of RAM chip 20-800 while a binary ZERO is written into the first bit location of RAM chip 20-802. The second address sequence continues with binary ones being written into the 1024 bit locations of RAM chip 20-800 and binary ZEROS being written into the 1024 bit locations of RAM chip 20-802. During the second addressing sequence, the binary ZERO and binary ONE outputs from flip-flops 20-804 and 20-806 enable data words and row addresses to be written into the level 1 cache and directory locations, respectively.

During the third and fourth addressing sequences, data words and row addresses are written into second and third levels of cache store 20-400 and directory 20-84. For further information regarding the QLT mode of operation, reference may be made to U.S. Pat. No. 4,195,343.

Directory and Cache Write Control Circuits 20-82

Figure 3B:
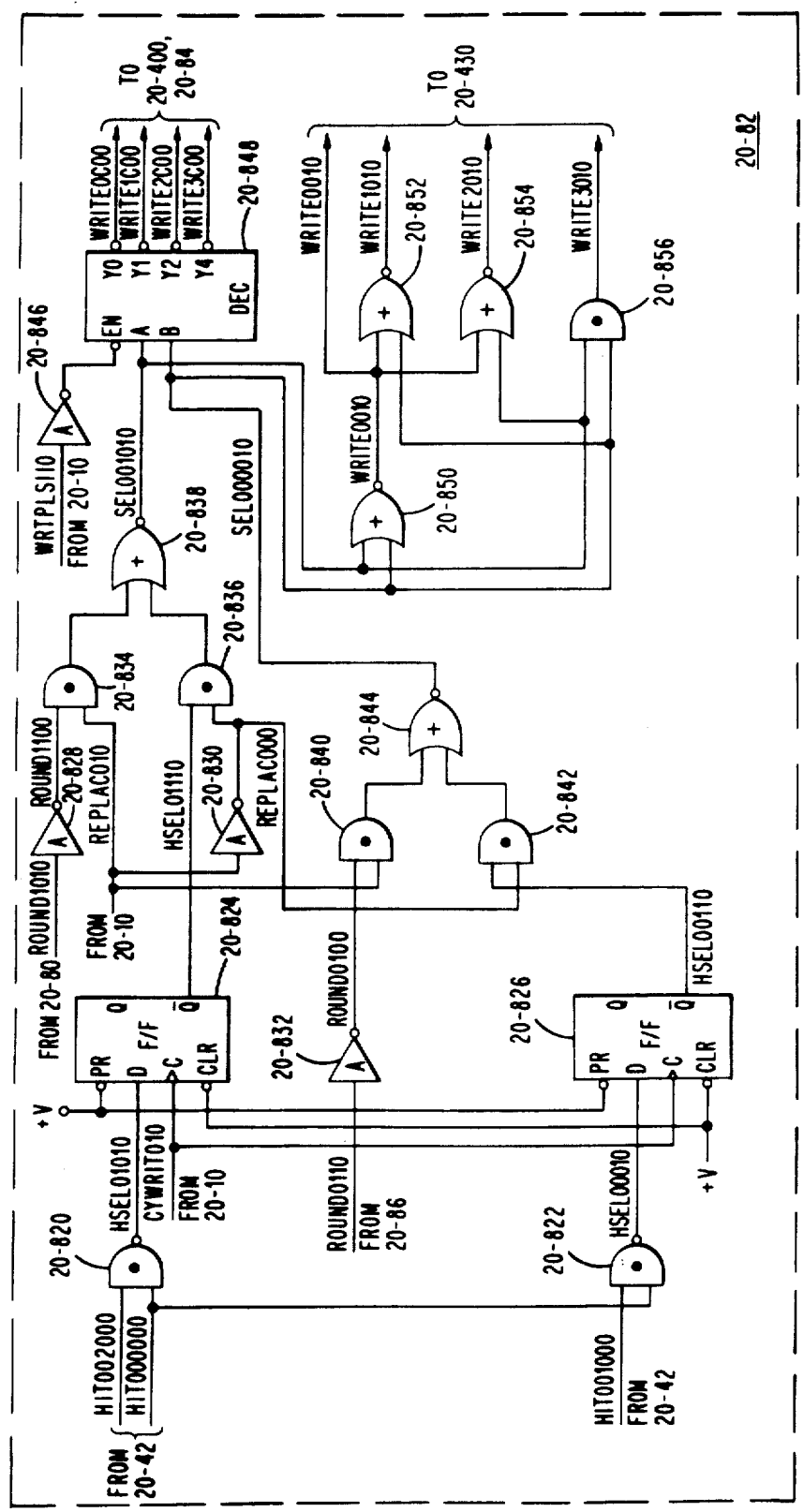
FIG. 3b shows the directory and cache write control circuits of the cache unit of FIG. 1.

The directory and cache store write control circuits of block 20-82 are shown in greater detail in FIG. 3b. These circuits in response to cache hit signals HIT001000 through HIT002000 from Section 20-4 and round robin signals ROUND0110 and ROUND1010 from sections 20-86 and 20-80 are operative to generate sets of write signals WRITEOC00 through WRITE3C00 and WRITE0010 through WRITE3010. The signals WRITEOC00 through WRITE3C00 are applied to cache store 20-400 and cache directory 20-84 for enabling data words and row addresses to be written into the specified cache and directory locations during both replacement and write cycles of operations.

In greater detail, the circuits of block 20-82 include a pair of NAND gates 20-820 and 20-822, a pair of D-type flip-flops 20-824 and 20-826, a plurality of inverter circuits 20-828, 20-830, 20-830, 20-832 and 20-846, a plurality of AND gates 20-834, 20-836, 20-840, 20-842 and 20-856, a plurality of NOR gates 20-838, 20-844, 20-850 through 20-854 and a decoder circuit 20-848. The NAND gates 20-820 and 20-822 in response to signals HIT000000 through HIT002000 generate hit select signals HSEL01010 and HSEL00010, respectively, for setting D-type flip-flops 20-824 and 20-826. Two sets of AND/NOR gates 20-834, 20-836, 20-838 and 20-840, 20-842, 20-844 combine different ones of the round robin signals ROUND1010, ROUND0110, replacement signals REPLAC010 and REPLAC000 and hit select signals HSEL01110, HSEL00110 to generate select signals SEL001010 and SEL000010 as shown. The signals are decoded by decode circuit 20-848 and result in an appropriate one of the write signals WRITEOC00 through WRITE3C00 being forced to a binary ZERO state in response to write signal WRTPLS110. Also, signals SEL00010 and SEL001010 are selectively combined within NOR gates 20-850 through 20-854 and AND gate 20-856 for generating corresponding ones of the write signals WRITE0010 through WRITE3010.

Cache Directory 20-84

As seen from FIG. 2, each level of the 4-level cache directory includes three RAM chips, each chip containing 1024 by 4 bit locations. Each RAM chip receives column address signals ADDR08200 through 17200 from section 20-5. These signals correspond to the most significant 10 address bits of the main store request address (i.e., bits 0–9). All of the chips of the directory 20-84 are enabled by grounding the chip select terminals (CS) of the chips as indicated in FIG. 2.

Additionally, the three chips of each level receive a corresponding one of the write enable signals WRITEOC00 through WRITE3C00 from section 20-82. When any one of these signals is forced to a binary ZERO, all of the chips of the designated level are enabled for a write operation.

During normal operation, the directory address data to be written into the designated level is inverted and applied via tristate driver circuits of block 20-86 to a corresponding one of sets of data in lines as one of the sets of signals HDAT00B10-HDAT09B10 through HDAT30B10-HDAT39B10 of the designated level. Additionally, as explained herein, parity generator circuits included within block 20-86 generate signals PBIT001A1, PBIT011A1 through PBIT001D1, PBIT011D1 which are the sets of parity bits for different five bit portions of the row address which are also written into the designated directory level.

Directory Parity and Mode Control Circuits 20-86

The directory parity and mode control circuits of block 20-86 are shown in greater detail in FIG. 3c. These directory parity circuits include the parity generation circuits, address and parity driver circuits and comparator circuits of block 20-860. The mode control circuits include the hit comparator, mode control and the error indicator circuits of block 20-880.

As seen from FIG. 3c, block 20-860 includes a pair of parity generator circuits 20-861 and 20-862, each of which generates a parity bit for a different five bits of the row address portion (i.e., signals ADDR00110-ADDR08110, ADDROA110) of the input memory address from Section 20-10. Additionally, each of the circuits 20-861 and 20-862 receive an additional signal TSTPAR110. This signal is selectively generated by test mode section 20-3 and causes incorrect parity bits to be generated for the different five row address bits.

The same row address is applied to the inverter tristate driver circuit of block 20-863. These circuits are enabled during a write operation by signal CYWRIT000 being forced to a binary ZERO. This causes the inverted row address to be applied at the driver output terminals as signals HDAT00A10 through HDAT39A10.

From there, they are applied to the data input/output terminals of the cache directory chips of each of the levels of directory 20-84. During each read operation, the driver circuits of block 20-863 are disabled enabling the cache directory row address read out from directory 20-84 to be applied as the four sets of signals HDAT00010-0810 through HDAT03010-3910 to comparator circuits 20-420 through 20-428. As mentioned, these signals are compared with the row address for determining the occurrence of a bit condition.

In a similar fashion, the generated odd parity signals DPBIT0000 and DPBIT1000 are applied to the inputs of inverting tristate driver circuits 20-864a through 20-864d. When enabled during a write operation, the inverted parity signals are applied to the input/output terminals of the cache directory chips of the directory levels of directory 20-84. By inverting the row address and associated parity bits therewith, it is possible to reduce the amount of logic circuits required to perform the desired comparison.

During a read operation, the driver circuits 20-864a through 20-854d are disabled and the four pairs of parity bit signals read out from directory 20-84 are applied to corresponding ones of the four comparator circuits 20-866a through 20-866d of block 20-866. The pairs of directory parity signals are compared with the parity signals DPBIT0010 and DPBIT1010 generated by circuits 20-861 and 20-862.

As seen from FIG. 3c, each of the comparator circuits 20-866a through 20-866d includes a pair of exclusive OR gates (e.g. 20-867a and 20-868a) whose outputs are combined within an output NOR gate (e.g. 20-869a). When the row address generated parity bits compare bits read out from the corresponding directory level, then the output NOR gate forces a corresponding one of the hit enable signals HITEN0010 through HITEN3010 to a binary ONE state. This indicates that no directory parity error was detected. When a directory parity error is detected in a level, a corresponding one of the signals HITEN0010 through HITEN3010 is forced to a binary ZERO state.

The hit enable signals are applied as inputs to the circuits of block 20-880. These circuits include four OR gates 20-881 through 20-884 which combine the hit enable signals HITEN0010 through HITEN3010 with the hit signals HIT000000 through HIT003000 from Section 20-42 to generate hit invalid signals PARERRA00 through PARERRD00. When a hit condition is detected by the circuits of Section 20-42, a corresponding one of the signals HIT000000 through HIT003000 is forced to a binary ZERO state. When a directory parity error is detected by the comparator circuits 20-866, the hit enable signal for that level is forced to a binary ZERO. This in turn causes one of the OR gates 20-881 through 20-884 to force the appropriate hit invalid signal to a binary ZERO state.

All four of the hit invalid signals are combined within a NAND gate 20-887. This gate forces signal PARERR010 to a binary ONE in response to an invalid hit (i.e., when one of the signals PARERRA00 through PARERRD00 is a binary ZERO). The signal PARERR010 is selectively clocked into a D-type flip-flop 20-888 in response to signal CPRCLK010. Signal CPRCLK010 is generated by an AND gate 20-899, in response to signal CPRCLK100 from section 20-10 and a stop parity directory signal STPDIR000 from test mode section 20-3. The state of flip-flop 20-888 signals when the directory parity error condition is valid (i.e., occurs during a directory read cycle of operation).

Also, the invalid hit signals are combined within a pair of NAND gates 20-885 and 20-886, as shown. That is, the invalid hit signals for levels 0 and 1 are combined within NAND gate 20-885 while the invalid hit signals for levels 2 and 3 are combined within NAND gate 20-886. When NAND gate 20-885 forces signal DIRPE0010 to a binary ONE, this signals the detection of an invalid hit within levels 0 and 1. Similarly, when NAND gate 20-886 forces signal DIRPE1010 to a binary ONE, this signals the detection of an invalid hit within levels 2 and 3.

The directory hit signals DIRPE0010 and DIRPE1010 are combined with parity error valid signal PARERR110 within a further pair of NAND gates 20-889 and 20-890. When NAND gate 20-889 forces signal DIRPE0000 to a binary ZERO state, this signals that a valid error was detected as having occurred within directory level 0 or 1. Similarly, when NAND gate 20-890 forces signal DIRPE1000 to a binary ZERO state, this signals that a valid error was detected as having occurred within level 2 or 3.

The signals DIRPE0000 and DIRPE1000 respectively control the switching of a pair of D-type flip-flops 20-892 and 20-894. When either signal is switched to a binary ZERO, it causes a corresponding one of the flip-flops 20-892 and 20-894 to switch to a binary ONE state. Additionally, the clock input terminal of each of the flip-flops 20-892 and 20-894 is coupled to receive from test mode section 20-3, a clocking signal TESTMD11D. The D input terminal of flip-flop 20-892 receives bus data signal BSDT02210 while the D input terminal of flip-flop 20-894 receives bus data signal BSDT03210. As explained herein, when clocking signal TESTMD11D switches positive, each of the flip-flops 20-892 and 20-894 switches to the states specified by the states of data signals BSDT02210 and BSDT03210, respectively.

The output signals DBANK0000 and DBANK1000 from the flip-flops are used to control the counting sequence of the round robin circuits as well as the operation of other cache sections. For example, these signals are combined with the most significant bit signal ROUND0010 from round robin Section 20-80 within the series connected pair of NAND gates 20-895 and 20-896. The output signal ROUND0110 generated by the output gate 20-895 controls or establishes the state of the most significant bit signal ROUND0110 initially generated by the round robin counter circuits of Section 20-80.

More specifically, when both signals DBANK0000 and DBANK1000 are binary ONES, the state of signal ROUND0110 changes as a function of signal ROUND0010. Therefore, the round robin counting sequence proceeds normally.

However, when signal DIRPE0000 switches to a binary ZERO, signal DBANK0000 switches to a binary ZERO. This causes NAND gate 20-895 to force signal ROUND0110 to a binary ONE state. The most significant bit ROUND0110 signal remains a binary ONE as long as signal DBANK0000 is a binary ZERO. Accordingly, the round robin counting sequence is altered so as to only specify levels 2 and 3.

Similarly, when signal DIRPE1000 switches to a binary ZERO, signal DBANK1000 switches to a binary ZERO. This causes NAND gate to force signal ROUND0200 to a binary ONE. The result is that NAND gate 20-895 forces most significant bit signal ROUND0110 to a binary ZERO. This alters the round robin counting sequence so that only levels 0 and 1 are specified. Additionally, signals DBANK0000 and DBANK1000 are applied as inputs to pairs of the comparator circuits of Section 20-42. Thus, the pairs of comparator circuits are inhibited from generating hit signals as a function of the states of signals DBANK0000 and DBANK1000.

Additional gates 20-897, 20-898, 20-900 and 20-906 are used to report to the CPU 10 when the cache is operating in a degraded mode, has signalled the occurrence of a directory parity error as a memory yellow or correctable error condition and when the cache is being placed off-line, signalled as a memory red or uncorrectable error condition. More specifically, OR gate 20-900 combines a yellow error signal YELLOW010 with a bus cache yellow signal CADYL0110 to produce memory yellow error signal CADYL0010 which is applied to the control lines of bus 18. A further D-type flip-flop 20-891 is used to store the occurrence of a first valid parity error, which results in signal YELLOW010 being forced to a binary ONE.

Also, the binary ZERO outputs from flip-flops 20-892 and 20-894 are applied to NAND gate 20-906. When either flip-flop switches to a binary ONE causing the degrading of cache unit 20, NAND gate 20-906 forces signal DGRADE010 to a binary ONE. This signal is applied to a check indicator for signalling when the cache is operating in a degraded mode.

When both flip-flops 20-892 and 20-894 are binary ONES, then NOR gate 20-897 forces signal DIRRED010 to a binary ONE state which is forwarded to CPU 10 via OR gate 20-898 for signalling the occurrence of an uncorrectable condition. The output signal PARERR010 from NAND gate 20-887 is inverted by gate 20-903 to produce signal PARERR000 which is combined in NAND gate 20-902 which cache hit signal CACHIT110 generated by NAND gate 20-902. The resulting signal CACHIT200 is forwarded to section 20-10 and is used to generate a main memory request as in the case of a normal cache miss condition.

ADDRESS, REPLACEMENT AND UPDATE LOGIC SECTION 20-10

Figure 3D:
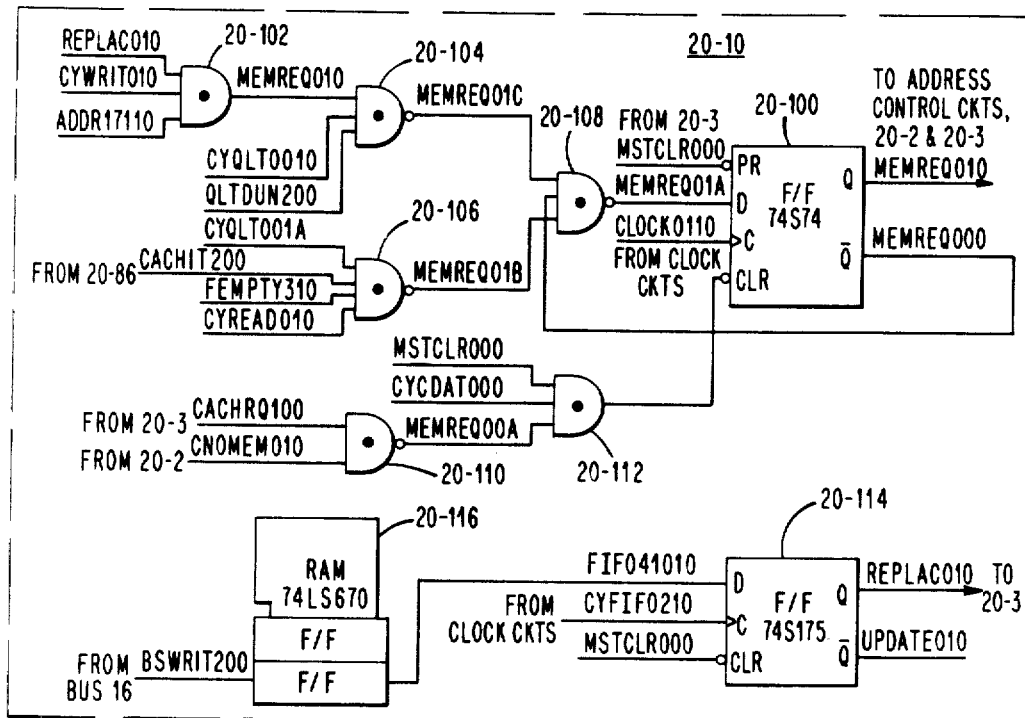
FIG. 3d shows a portion of the replacement circuits of the cache unit of FIG. 1.

A portion of the replacement circuits of block 20-10 are shown in greater detail in FIG. 3d. These circuits include a memory request cycle flip-flop 20-100 and associated gates 20-102 through 20-112, and a replacement/update flip-flop 20-114 which couples to a first in first out (FIFO) storage 20-116.

The memory request cycle flip-flop 20-100 is switched to a binary ONE during initialization when a master clear signal MSTCLR000 applied to a preset terminal (PR) is forced to a binary ZERO. This causes the cache unit 20 to be initialized to a known state as explained herein. During a replacement operation (i.e., when signal REPLAC010=1) during a write cycle of operation (CYWRIT010=1) when address bit 17 is a binary ONE (i.e., signal ADDR17110=1), AND gate 20-102 forces signal MEMREQ01D to a binary ONE. Signal MEMREQ01D conditions NAND gate 20-104 to force signal MEMREQ01C to a ZERO when the QLT flip-flop (not shown) is a binary ONE (i.e., signal CYQLT0010=1) and the QLT operation has not been completed (i.e., signal QLTDUN 200=1). When a binary ZERO, signal MEMREQ01C causes NAND gate 20-108 to force signal MEMREQ1A to a binary ONE when flip-flop 20-100 is in a binary ZERO state and signal MEMREQ01B is a ONE. When clocking signal CLOCK0110 goes positive, signal MEMREQ1A switches flip-flop 20-100 to a binary ONE.

These circuits operate to utilize cache unit 20 as follows. Signal MSTCLR000 when switched to a binary ZERO, causes memory request flip-flop 20-100 to switch to a binary ONE state. Signal MEMREQ010 conditions address control circuits included as part of section 20-10 and bus circuits of section 20-3 to initiate memory read request to main store 20 via bus 10. The first cache read request applies an even address to main store 12 while the second cache request applies an odd address to main store 12. When both words are received, this forces a data cycle signal CYCDAT000 to a binary ZERO which resets memory request flip-flop 20-100 to a binary ZERO.

During the second data cycle, signals REPLAC010, CYWRIT010 and ADDR17110 are all binary ONES. This causes AND gate 20-102 to force signal MEMREQ010 to a binary ONE which causes NAND gate 20-104 to force signal MEMREQ01C to a binary ZERO. When clocmk signal CLOCK0110 switches positive, memory request flip-flop 20-100 is again switched to a binary ONE. This initiates another cache read request to main store 12. When the last word (e.g. 4096th) is requested from main store 12 is being transferred from main store 12, AND gate 20-102 again forces signal MEMREQ01D to a binary ONE. However, signal QLTDUN200 has been switched to a binary ZERO signalling the end of the initialization operation. This inhibits memory request flip-flop 20-100 from being set to a binary ONE again. At the completion of the initialization operation, cache store section stores the contents of the first 4096 locations of main store 12 while directory section 20-8 stores the row addresses of the addresses of the first 4096 main store locations. For further information regarding the initialization procedure, reference may be made to U.S. Pat. No. 4,190,885.

Additionally, in the absence of a QLT cycle (i.e., signal CYQLT001A=1), when the requested data is not stored in cache (i.e., signal CACHIT200=1), the FIFO storage 20-116 is empty (i.e., signal FEMPTY310=1) and during a cache read cycle of operation (i.e., signal CYREAD010=1), NAND gate 20-106 operates to force signal MEMREQ01B to a binary ZERO. This causes NAND gate 20-108 to force signal MEMREQ01A to a binary ONE which switches flip-flop 20-100 to a binary ONE in response to clocking signal CLOCK0110. Additionally, flip-flop 20-100 also switches to a binary ONE, in response to signal CLOCK010, when signal MEMREQ000 is a binary ZERO. The memory request flip-flop 20-100 is reset to a binary ZERO, in response to master clear signal (i.e., signal MSTCLR100=0), during a data cycle (i.e., signal CYCDAT000=0), or in the absence of a CPU request (i.e., signal CACHRQ100=1) when see no memory flip-flop of section 20-3 is set to a binary ONE (i.e., signal CNOMEM010=1).

The FIFO buffer 20-116 contains four RAM 44-bit registers which couple to bus 16 and are conditioned for storing the information received from bus 16. This information includes the state of the bus write control line BSWRIT. When signal BSWRIT200 is a binary ONE, the memory command received from bus 16 is a read command. A memory write command is denoted by signal BSWRIT200 being a binary ZERO.

When signal FIFO41010 is a binary ONE, the replace/update flip-flop 20-114 is switched to a binary ONE when FIFO cycle signal CYFIFO210 goes positive. When in a binary ONE state, flip-flop 20-114 forces signal REPLAC010 to a binary ONE signalling that a cache replacement cycle is to be performed. That is, a replacement cycle occurs when CPU 10 generates cache request signal CACHRQ010 and the requested information is not stored in cache. The cache unit 20 generates a request to main store 12 over bus 16 and the requested information received from main store is sent to CPU 10 and written into cache section 20-4 completing the replacement operation.

When CPU 10 generates memory write request to main store 12 which updates information in main store 12, the cache unit 20 checks to see if the information is also stored in section 20-4. When it is, section 20-4 information is updated with the new information. In this case, signal FIFO41010 is a binary ZERO which causes flip-flop 20-114 to be switched to a binary ZERO. Signal UPDATE010 when forced to a binary ONE signals that a cache update cycle is to be performed. Replace/update flip-flop 20-114 is reset when master clear signal MSTCLR000 is switched to a binary ZERO.

BUS INTERFACE SECTION 20-2

Figure 3E:
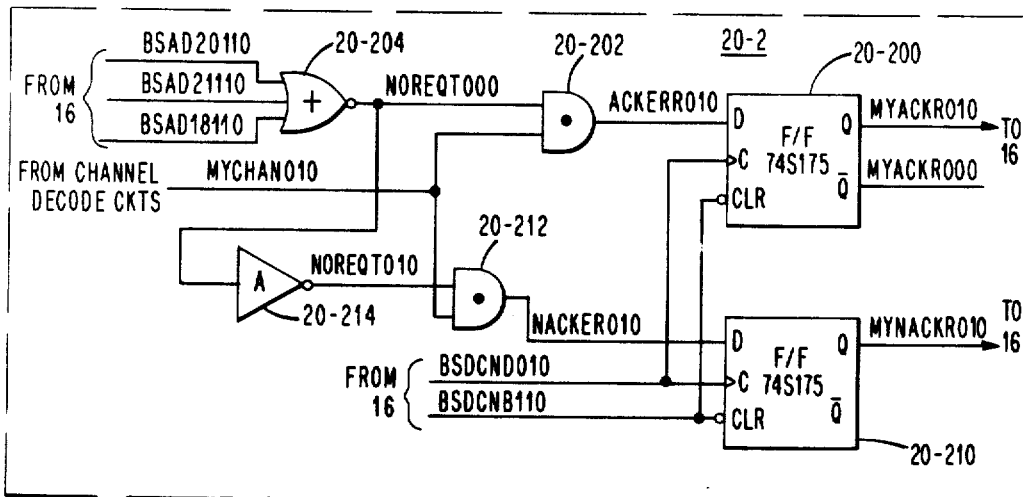
FIG. 3e shows a portion of the bus interface circuits of the cache unit of FIG. 1.

FIG. 3e shows in greater detail, a portion of the circuits of section 20-2. These circuits include a memory acknowledgement flip-flop 20-200 and associated gates 20-202 and 20-204, in addition to a negative acknowledgement flip-flop 20-210 with associated gate 20-212 and inverter circuit 20-214. Both flip-flops are connected to receive signals BSAD18110-20110 representative of bus address bits 18, 20 and 21. These bits correspond to a function code which is applied to the address lines of bus 16 along with the cache command applied to the data lines of bus 16. Additionally, a channel number is applied to the address lines of bus 16. When the channel number corresponds to the cache unit 20, my channel signal MYCHAN010 is forced to a binary ONE.

NOR gate 20-204 forces signal NOREQT000 to a binary ONE when signals BSAD18110, BSAD21110 and BSAD20110 are binary ZEROS. This, in turn, causes AND gate 20-202 to force signal ACKERR010 to a binary ONE. During the data cycle portion of the bus cycle of operation signal BSDCND010 is switched positive which sets memory acknowledgement flip-flop 20-200 to a binary ONE. The flip-flop 20-200 is reset at the end of the data cycle which signal BSDCNB110 switches to a binary ZERO.

When NOR gate 20-204 switches signal NOREQT000 to a binary ONE, inverter circuit 20-214 switches signal NOREQT010 to a binary ZERO. This causes AND gate 20-212 to switch signal NACKER010 to a binary ZERO. Thus, negative acknowledgement flip-flop 20-210 is switched to a binary ZERO in response to signal BSDCND010. When one of the signals BSAD18110, BSAD21110 or BSAD20110 is a binary ONE, NOR gate 20-204 forces signal NOREQT000 to a binary ZERO. Thus, AND gate 20-202 forces signal ACKERR010 to a binary ZERO while AND gate 20-212 forces signal NACKER010 to a binary ONE when channel number signal MYCHAN010 is a binary ONE. The bus response signwls MYACKR010 and MYNAKR010 are applied to the control lines of bus 16 for signalling CPU 10 whether or not the cache unit 20 has accepted the command.

TEST MODE SECTION 20-3

Figure 4:
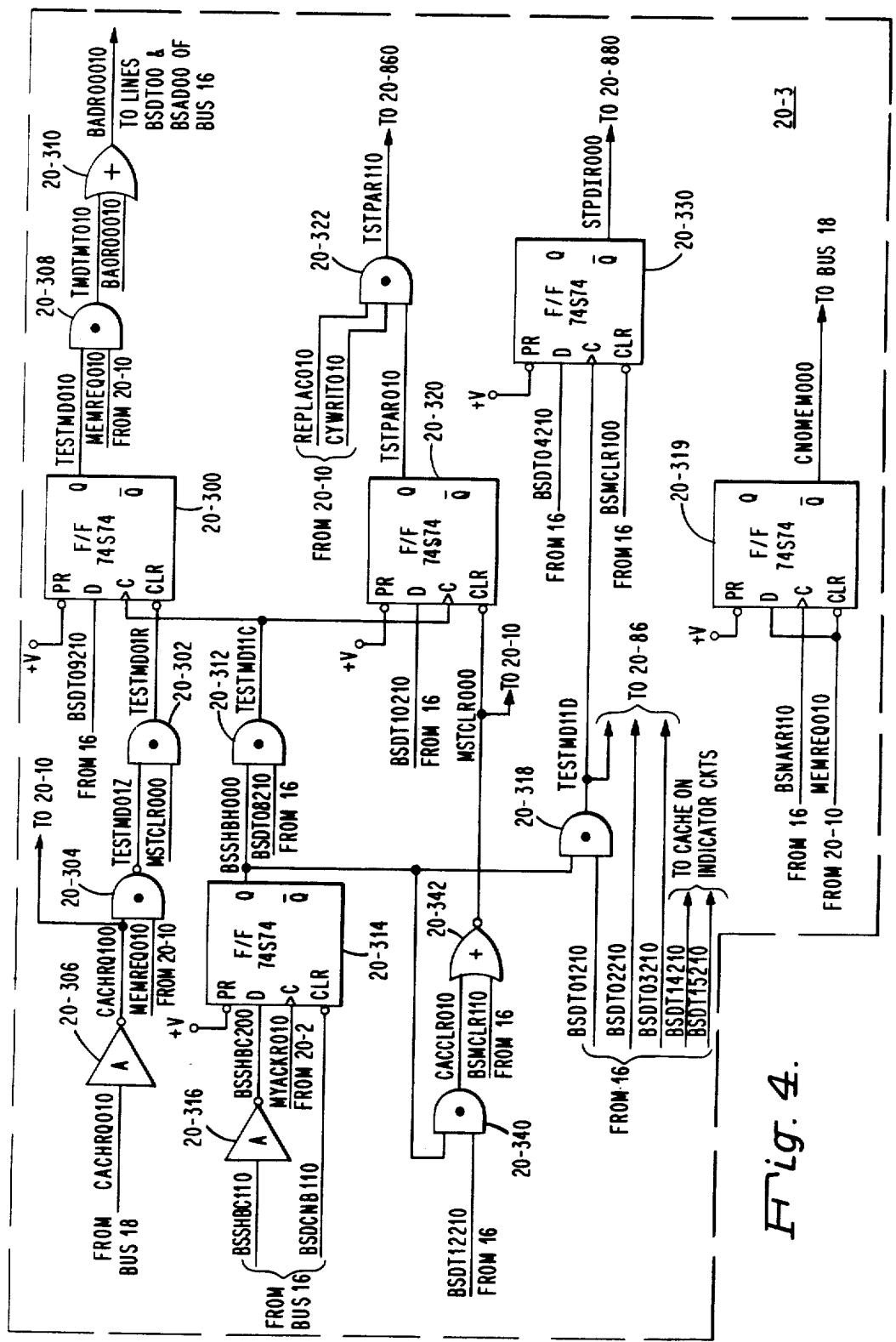
FIG. 4 shows in greater detail, the test mode apparatus of the present invention.

FIG. 4 shows in greater detail, the test mode circuits of section 20-3 constructed according to the principles of the present invention. These circuits include a "no hit fault" mode flip-flop 20-300 with associated gates and inverter circuits 20-302 through 20-316. Flip-flop 20-300 is is switched to a binary ONE when bus data signal BSDT09210 is forced to a binary ONE upon clocking signal TESTMD11C being forced positive. AND gate 20-312 forces signal TESTMD11C positive when bus data signal BSDT08210 is a binary ONE and flip-flop 20-314 has been switched to a binary ONE state. The flip-flop 20-314 is switched to a binary ONE when a second half bus cycle signal BSSHBC110 is a binary ZERO, upon my acknowledgement signal MYACKR010 being switched positive by the circuits of section 20-2. Flip-flop 20-314 is reset to a binary ZERO when signal BSDCNB110 is forced to a binary ZERO.

No hit fault flip-flop 20-300 is reset to a binary ZERO when AND gate 20-302 forces signal TESTMD01R to a binary ZERO, in response to a master clear signal (i.e., signal MSTCLR000=1), or when NAND gate 20-304 forces signal TESTMD01Z to a binary ZERO. NAND gate 20-304 forces signal TESTMD01Z to a binary ZERO when cache request signal CACHRQ010 from CPU 10 is a binary ZERO and memory request signal MEMREQ010 is forced to a binary ONE by the circuits of section 20-10. Signal MSTCLR000 is forced to a binary ZERO via a NOR gate 20-342 when an AND gate 20-340 forces a cache clear signal CACCLR010 to a binary ONE or when the system of FIG. 1 is initialized causing a bus master clear signal BSMCLR110 to be forced to a binary ONE. Signal CACCLR010 is forced to a binary ONE in response to a cache initialize command which forces bus data signal BSDT12210 to a binary ONE when signal BSSHBH000 is a binary ONE.

The binary ONE output signal TESTMD010 from "no hit fault" flip-flop 20-300 is combined with memory request signal MEMREQ010 in AND gate 20-308. When signals TESTMD010 and MEMREQ010 are binary ONES, AND gate 20-308 forces signal TMDTMT010 to a binary ONE causing OR gate 20-310 to force the most significant address bit signal BADR00010 to a binary ONE. The signal BADR00010 when a binary ONE is representative of a non-existent memory address. This causes the main store 12 to force the bus negative acknowledgement line BSNAKR to a binary ONE. Signal BSNAKR110 when forced to a binary ONE switches a see no memory flip-flop 20-319 to a binary ONE when memory request signal MEMREQ010 is a binary ONE. When a binary ONE, flip-flop 20-319 forces signal CNOMEM000 to a binary ZERO which signals CPU 10 via bus 18 that a non-existent address/resource was specified by the memory request.

Additionally, signal BSSHBH000 is applied as an input to AND gate 20-318. AND gate 20-318 receives bus data signal BSDT01210. When both signals are binary ONES, AND gate 20-318 forces signal TESTMD11D to a binary ONE. This signal is applied to the clock input terminals of bank mode flip-flops 20-892 and 20-894 of section 20-86 enabling their states to be established as a function of bus data signals BSDT02210 and BSDT03210 applied via section 20-3. Also, bus data signals BSDT14210 and BSDT15210 coded for specifying a cache bypass mode of operation are applied via section 20-3 to cache on indicator circuits used for signalling CPU 10 when cache unit 20 has been placed in a bypass or off-line state.

Additionally, the test mode" circuits include a "force directory parity mode" flip-flop 20-320, as shown. This flip-flop is switched to a binary ONE when bus data signal BSDT10210 is forced to a binary ONE, upon clocking signal TESTMD11C being forced positive. The flip-flop 20-320 is reset to a binary ZERO when master clear signal MSTCLR000 is forced to a binary ZERO. The binary ONE output signal TSTPAR010 of flip-flop 20-320 is applied as one input to AND gate 20-322. AND gate 20-322 also receives replace signal REPLAC010 and cache write signal CYWRIT010 from section 20-10. When all three signals are binary ONES, AND gate 20-322 forces test parity signal TSTPAR110 to a binary ONE. This signal when a binary ONE conditions the parity generator circuits 20-861 and 20-862 to produce invalid parity signals as discussed herein.

Lastly, the test mode circuits include an enable/disable parity flip/flop 20-330. This flip-flop is switched to a binary ONE when bus data signal BSDT04210 is a binary ONE, upon signal TESTMD110 being forced positive. When a binary ONE, flip-flop 20-330 forces stop directory signal STPDIR000 to a binary ZERO. Signal STPDIR000 is applied to the circuits 20-86 for inhibiting the operation of the error checking and error reporting circuits as explained herein. Flip-flop 20-330 is reset to a binary ZERO when a bus clear signal BSMCLR100 is forced to a binary ZERO.

DESCRIPTION OF OPERATION

With reference to FIGS. 1 through 5, the preferred embodiment of the test mode apparatus of the present invention will now be described with reference to the flow diagrams of FIGS. 6 and 7.

Cache Unit 20

Figure 7:
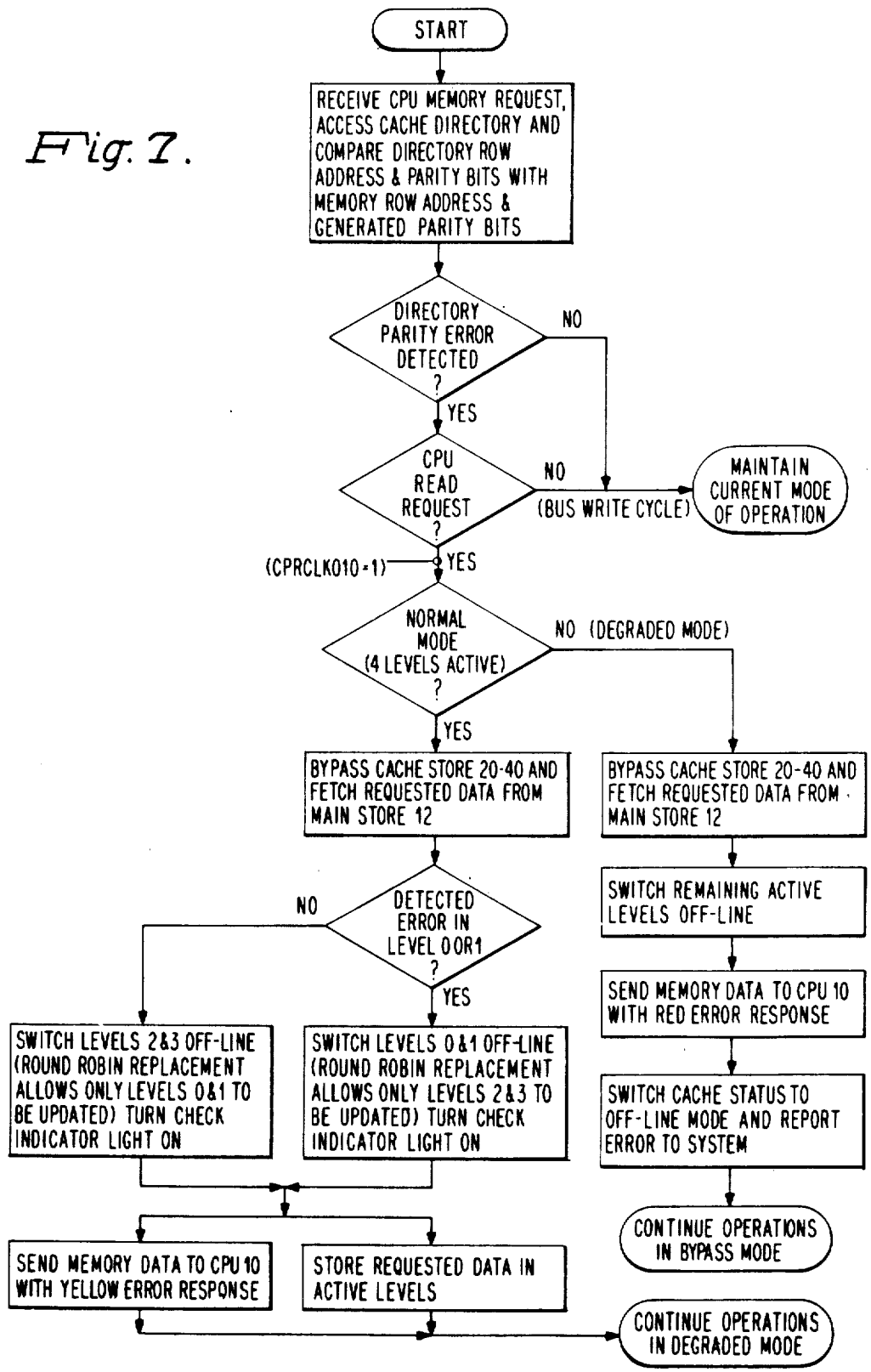
FIG. 7 is a flow diagram which illustrates the operations performed by the cache unit of FIG. 1.

However, before proceeding with the above, it would facilitate an understanding of the present invention to first describe the operation of the cache unit of the preferred embodiment with reference to the flow diagram of FIG. 7.

The cache unit 20 provides for graceful degradation by causing mode transitions proceeding from a normal mode of operation wherein all four cache levels are operative or active to a degraded mode of operation wherein two levels are operational or active and then to a bypass mode of operation wherein no levels are operational or active. The flow diagram of FIG. 7 illustrates how the occurrences of these mode transitions take place.

It is assumed that the cache unit 20 has been initialized and is operating normally. By way of example, successful read requests are issued by CPU requesting data which has been stored in cache and whose access produces a directory parity error. When CPU 10 issues a memory read request to the cache unit 20 of FIG. 1, the 20 bit main memory address is applied to the address lines of interface 18 together with the appropriate bus control signals.

From FIG. 2, it is seen that the 10-bit column address corresponding to signals ADDR08200 through ADDR17200 are applied to the various portions of the directory and cache sections 20-8 and 20-4. Also, at that time, the 10-bit row address corresponding to signals ADDR0010 through ADDR0710, signals ADDR0A10 and ADDR0B10 being applied to the hit/miss control circuits 20-42.

The column address applied to cache directory 20-84 of FIG. 2 causes the read out of a row address from each of the four directory levels. since this is a read operation, the driver circuits 20-863 of FIG. 3c are disabled. Accordingly, the row address corresponding to signals HDAT00B10 through HDAT39B10 are applied as inputs to the comparator circuits 20-420 through 20-426.

In parallel with the above, the parity generation circuits 20-861 and 20-862 of FIG. 3c generate parity bit signals DPBIT0010 and DPBIT1010 from the input row address. Since this is a read operation, the driver circuits 20-864a through 20-864d are inhibited. Accordingly, the sets of parity bit signals read out from the directory levels are applied as inputs to comparator circuits 20-869a through 20-869d.

The comparator circuits 20-420 through 20-426 are operative to compare the four directory row addresses with the memory request row address. Since it is assumed that the data being requested has been stored in cache store 20-40, one of the comparator circuits is operative to force one of the hit signals HIT000010 through HIT003010 to a binary ONE state indicative of the hit condition. Simultaneously, comparator circuits 20-866a through 20-866d are operative to compare the directory address parity bits with the parity bits generated from the memory row address.

Since it is assumed that the read request produces a directory parity error, one of the comparator circuits 20-866a through 20-866d is operative to force one of the hit enable signals to a binary ONE state. When the directory parity error occurs in the subdivision or set of levels from which the requested data is stored (i.e., where the hit occurred), then NAND gate 20-887 is operative to force directory parity error signal PARERR010 to a binary ONE.

Signal PARERR010 is generated approximately 90 nanoseconds following receipt of the memory request. Since this is a read request, approximately 40 nanoseconds later, signal PARERR010 is clocked into flip-flop 20-888 in response to timing signal CPRCLK010 from the clock circuits of Section 20-10. This results in parity error valid signal PARERR110 being forced to a binary ONE. This signal immediately gates the states of hit invalid signals DIRPE0010 and DIRPE1010 into degrade mode flip-flops 20-892 and 20-894.

From the flow chart of FIG. 7, it is seen that the detection of the directory parity error as signalled by signal PARERR110 results in the cache store 20-40 being bypassed and the requested data being fetched from main store 12. More specifically, the generation of a hit condition when signalled by the circuits 20-42 causes NAND gate 20-902 to force cache hit signal CACHIT110 to a binary ONE state. However, signal PARERR000 was forced to a binary ZERO when NAND gate 20-887 was switched to a binary ONE by one of the signals PARERRA00 through PARERRD00 being switched to a binary ZERO. This inhibits NAND gate 20-904 from switching signal CACHIT200 to a binary ZERO state. The result is that signal CACHIT200 causes the circuits of Section 20-10 to generate a memory request which is forwarded to main store 12.

As seen from FIGs. 4, the circuits 20-880 of FIG. 3c establish in which subdivision of cache the directory parity error occurred. More specifically, the states of degrade mode flip-flops 20-892 and 20-894 define which set or subdivision of levels are to be disabled.

It is assumed that the directory parity error occurred when data stored in level 0 was being accessed. Accordingly, cache operation proceeds to switch levels 0 and 1 off line as shown in FIG. 4. That is, flip-flop 20-892 is switched to a binary ONE state approximately 150 nanoseconds from the receipt of the memory request.

The result of the above switching forces degraded mode signal DBANK0000 to a binary ZERO. Signal DBANK1000 remains in a binary ONE state. Accordingly, NAND gate 20-895 switches the most significant round robin bit signal ROUND0110 to a binary ONE. This occurs approximately 5 nanoseconds following the switching of signal DBANK0000. Signal DBANK0000 causes NAND gate 20-895 to maintain the round robin bit signal ROUND0110 in a binary ONE state. Thus, the round robin counter section 20-80 of FIG. 3a effectively permits memory data to be replaced only within levels 2 and 3. Additionally, the binary ZERO signal DBANK0000 disables the level 0 and level 1 comparator circuits 20-420 and 20-422 of FIG. 2. Thus, levels 0 and 1 remain off-line relative to the processing of subsequent memory read requests.

As seen from FIG. 7, valid parity error signal PARERR110 forces yellow error response signal CADYL0010 to a binary ONE. As soon as the requested data from main store 12 is received by the cache unit 20, it is written into the next location of the level specified by the round robin level signal as modified by the circuits 20-880. That is, the replacement circuits of Section 20-10 are operative to force replace signal REPLAC010 to a binary ONE indicative of the replacement operation. This results in write cycle signal CYWRIT010 being forced to a binary ONE by the replacement circuits of Section 20-10.

As seen from FIG. 3a, signal CYWRIT010 causes the level signals ROUND0A10 and ROUND1A10 read out from round robin counter chips 20-800 and 20-802 in response to the memory request column address to be loaded into flip-flops 20-804 and 20-806. As mentioned previously, the most significant bit round robin counter is modified by the state of flip-flop 20-892 of FIG. 3c and is applied to the write control circuits of block 20-82. Since the cache unit 20 is carrying out a replacement operation, select signals SEL001010 and SEL000010 of FIG. 3b are generated as a function of round robin counter signals ROUND1010 and ROUND0110.

In greater detail, the binary ONE state of signal ROUND0110 when inverted, causes NOR gate 20-844 to force select signal SEL000010 to a binary ONE. Select signal SEL001010 is forced to a binary ONE or ZERO as a function of the state of signal ROUND1010. Upon the generation of write pulse signal WRTPLS110, by the replacement circuits of block 20-10, decoder circuit 20-848 forces either write signal WRITE2C00 or WRITE3C00 to a binary ZERO. Similarly, the circuits 20-850 through 20-856 force either write signal WRITE2010 or WRITE3010 to a binary ONE. Accordingly, the data from main store 12 is only written into level 2 or level 3 of the cache directory 20-84 and cache store 20-400.

As seen from FIG. 2, the memory request row address is written into the cache directory levels in response to signal WRITE2C00 or WRITE3C00. In the case of cache store 20-400, the signal WRITE2010 or WRITE3010 causes the select logic circuits 20-430 to force the appropriate one of the chip select signals CHIPS2000 or CHIPS3000 to a binary ZERO for enabling the level 2 or level 3 RAM chips. The data received from main store 12 corresponding to signals DATA00A10 through DATA19A10 is written into the location specified by column address in response to write signal WRITE2C00 or WRITE3C00.

As seen from FIG. 7, as the requested data is being written into cache store 20-400, it is forwarded to CPU via interface 18 along with yellow error response signal CADYL0010. Thereafter, the cache unit 20 continues to process memory requests in degraded mode.

As seen from FIG. 7, cache unit 20 continues to operate in the degraded mode until a further directory parity error is detected within the active or remaining cache levels which correspond to levels 2 and 3 in this example.

It will be assumed that the next memory read request which produces the error specifies accessing data stored within levels 2 or 3. In the manner described above, the circuits of Section 20-86 of FIG. 3c generate signals which result in hit invalid signal DIRPE1010 being forced to a binary ONE. Since this is a read request, flip-flop 20-888 is again switched to a binary ONE. This time parity error valid signal PARERR110 causes NAND gate 20-890 to force signal DIRPE1000 to a binary ZERO which switches degrade mode flip-flop 20-894 to a binary ONE.

As seen from FIG. 3c, signal DBANK1000 is switched to a binary ZERO which causes NOR gate 20-897 to force signal DIRRED010 to a binary ONE. This forces red error response signal CADRED010 to a binary ONE.

As seen from FIG. 7, the binary ZERO state of signal DBANK1000 causes active levels 2 and 3 to be switched off-line by disabling comparator circuits 20-426 and 20-428 of FIG. 2. The cache unit 20 operates to fetch data from main store 12 in the manner previously described. Upon receipt, the data is forwarded to CPU 10 via interface 18 along with red error response signal CADRED010. As seen from FIG. 4, CPU 10 can then take the necessary actions to generate status information indicating that cache unit 20 has been placed in a bypass or off-line mode of operation.

It will be appreciated that if the directory parity error first occurred when data stored within levels 2 and 3 was being accessed then levels 2 and 3 would be placed off-line as indicated in FIG. 4. More specifically, flip-flop 20-894 of FIG. 3c is switched to a binary ONE while flip-flop 20-892 remains in a binary ZERO state. Accordingly, this causes NAND gate 20-895 to force the most significant round robin counter bit signal ROUND0110 to a binary ZERO state. Accordingly, during replacement operations, data is permitted to be written only into levels 0 and 1 of cache directory 20-84 and cache store 20-400. That is, the circuits of Section 20-82 are conditioned by the state of signal ROUND0110 to force only write signals WRITE0C00 and WRITE1C00 to binary ZEROS and signals WRITE0010 and WRITE1010 to binary ONES.

Test Mode Section 20-3

Figure 5:
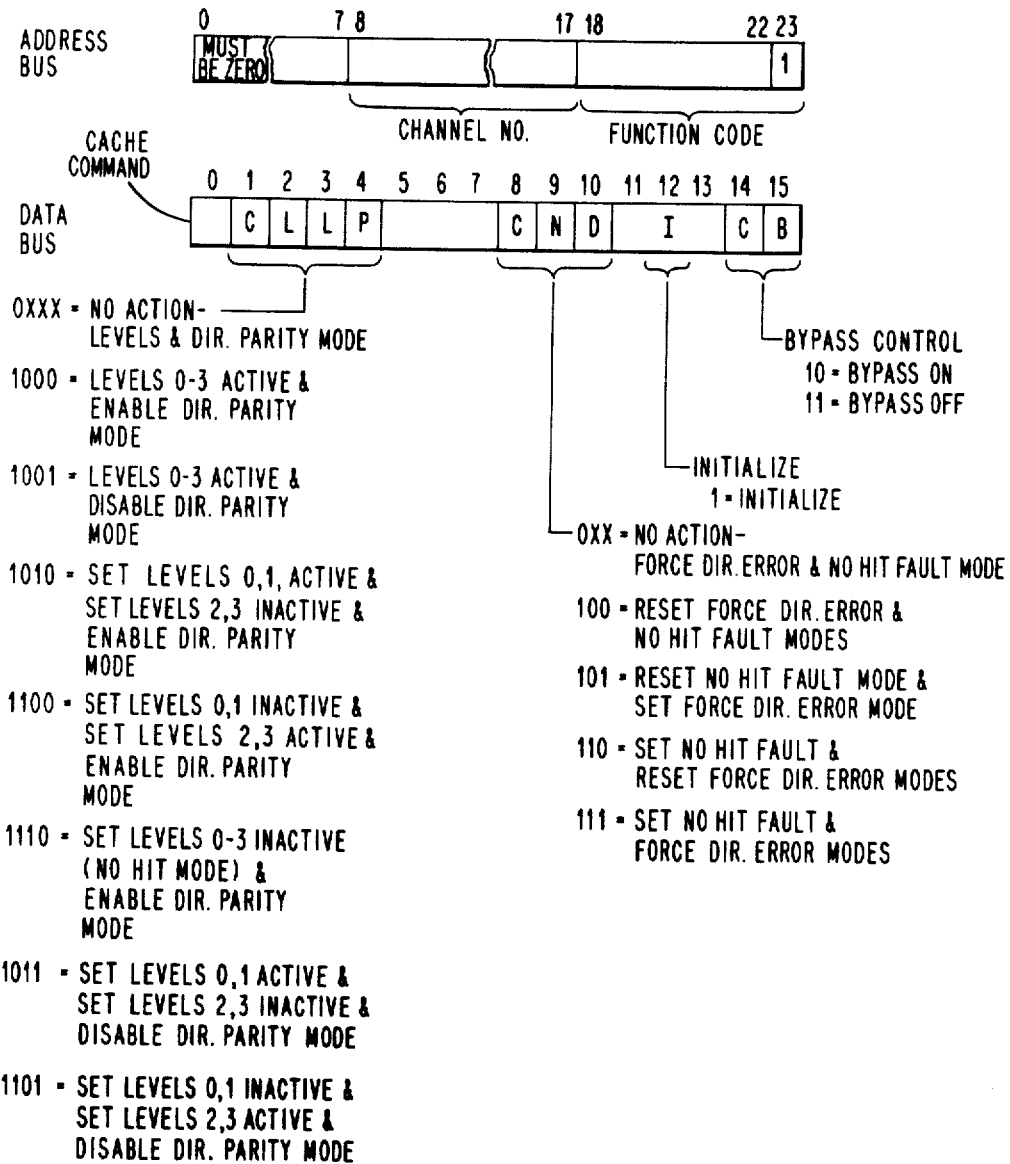
FIG. 5 shows the format of the commands used by the test mode apparatus of the present invention.

In accordance with the present invention and consistent with the convention established for transfers over bus 16, the format of FIG. 5 is used for information applied to the address and data lines of bus 16. As seen from the Figure, the 23 bits of information applied to the address lines include a 10-bit channel number code and a 6-bit function code. The channel number code and function code are loaded into one of the CPU's general registers (i.e., R6) as a first operand for reference by a rescan configuration (RSC) instruction.

The 16-bit cache command is coded to specify the action required to be performed by cache unit 20. These 16 bits are loaded into another one of the CPU's general registers (i.e., R7) as a second operand of the RSC instruction. The RSC instruction causes CPU 10 to transmit the contents of R7 along with the function code and channel number stored in R6. When the function code bits 18, 20 and 21 are all binary ZEROS, cache section 20-2 of FIG. 3e generates memory acknowledgement response signal MYACKR010 on bus 16 and cache unit 20 initiates the sequence of operations required for carrying out the cache operation specified.

In greater detail, a first field of bits 1-4 are coded to enable reconfiguration of the active cache levels, in addition to the enabling/disabling of directory parity circuits. As shown, bit 1 of the field serves as a clocking bit. When this bit is a binary ONE, it enables a change in the active levels and mode of operation of the directory parity circuits. Bits 2-3 of the field are coded to define the states of the active levels as indicated. Bit 4 of the field establishes the mode of operation of the directory parity circuits.

The next field includes bits 8-10 which are coded to establish the error mode of operation for the directory parity circuits, in addition to modes of operation for the no hit fault circuits of section 20-3. Again, bit 8 serves as a clocking bit. The field consisting of bit 12 is coded to specify an initialization mode of operation. The last field of bits 14-15 are used to specify a bypass mode of operation in which bit 14 also serves as a clocking bit. While the last two fields specify operations which are employed in other systems, such as the system disclosed in U.S. Pat. No. 4,190,885, discussed above. These modes are combined with the apparatus of the present invention to facilitate the testing of the cache unit 20.

Figure 6:
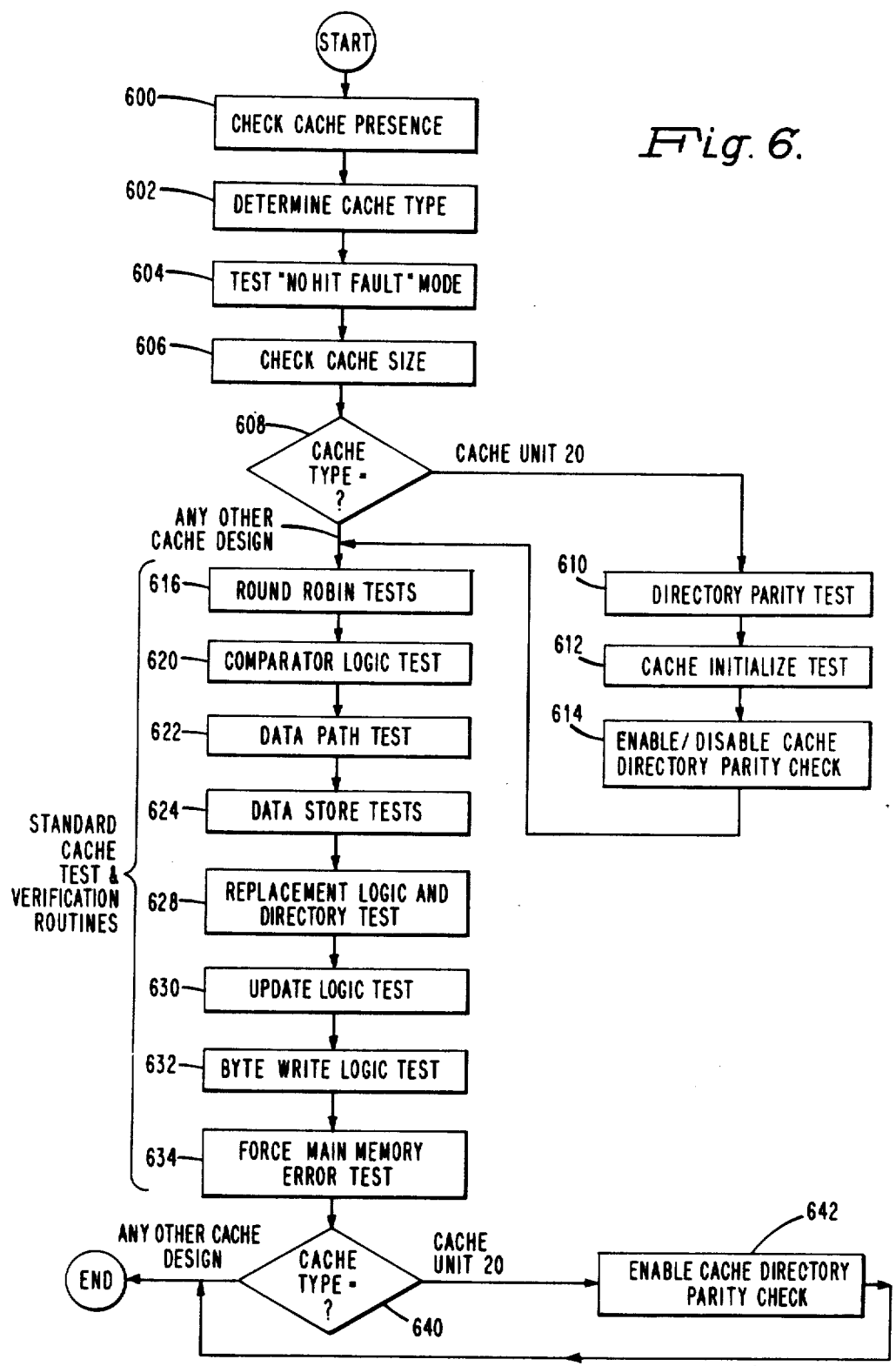
FIG. 6 is a flow diagram used in explaining the operation of the apparatus of the present invention.

Referring to FIG. 6, it is seen that first, CPU 10 identifies that cache unit 20 is present by performing the cache presence check of block 600. This is done by having CPU 10 execute an RSC instruction whose first operand contains the channel number assigned to cache unit 20 (i.e., done by switch settings on cache board) and a function code of hexadecimal "01". The second operand contains a cache command code of 2 which specifies that the cache unit 20 is operating in a bypass mode.

The circuits of block 20-2 of FIG. 3e are operative to acknowledge the command by forcing my acknowledgement signal MYACKR010 to a binary ONE.

When applied to bus 16, this signal sets a cache flag indicator register within CPU 10 to an appropriate value. CPU 10 tests the state of the indicator via a compare instruction.

The cache command code upon being decoded causes a cache on flip-flop, not shown, to be switched to a binary ZERO state. This, in turn, switches one of the control lines of bus 18 to a predetermined state which signals CPU 10 that the cache unit 20 has been bypassed (placed off line).

Since signal MYACKR010 was previously received, CPU executes another RSC instruction, which performs the operations of block 602. The first operand of the RSC instruction contains the assigned channel number and a non-zero function code of hexadecimal "27". The second operand has the same value hexadecimal "02". This instruction is used to determine the type of cache unit. The response to this test instruction is stored and used in a manner which enables the same cache test and verification routines designed for other earlier cache units to be employed. This arrangement is described in copending related patent application entitled "Enable/Disable Control Checking Apparatus", referenced above.

Also, the CPU 10 checks the "no hit fault mode" circuits and the size of cache unit 20 as indicated in blocks 602 and 604. That is, CPU 10 executes an RSC instruction which applies a cache command value of hexadecimal "400 B". This causes cache unit 20 to perform an initialize operation and set all four levels to an on state and enables directory parity checking.

As a result of the initialize operation, the cache unit 20 fills its directory and data sections 20-8 and 20-4 with the addresses and contents of the first 4096 word locations of main store 12. The round robin counter section 20-80 is set to replace level 0 contents when a next cache replacement cycle is initiated in response to a request from CPU 10. Next, CPU 10 sets the "no hit fault mode" flip-flop 20-300 of FIG. 4 to the on-state by issuing a cache command having the value hexadecimal "00C0". This forces both data bus bit signals BSDT08210 and BSDT09210 to binary ONES causing flip-flop 20-300 to switch to a binary ONE state. The operation of the no hit fault mode flip-flop 20-300 is tested when CPU 10 issues a memory read request having an address value greater than hexadecimal "1000" (i.e., 4096). When the flip-flop 20-300 and the associated circuits are operating properly, there is no hit detected (i.e., signal CACHIT200=1). Thus, the circuits of section 20-10 of FIG. 3d operate to switch signal MEMREQ01B to a binary ZERO which, in turn, causes memory request flip-flop 20-100 to switch to a binary ONE. This forces signal MEMREQ010 to a binary ONE, which causes AND gate 20-308 to force bus address signal BADR00010 to a binary ONE.

The result is that the bus circuits of main store 12 force bus negative acknowledgement signal BSNAKR110 to a binary ONE which sets CNOMEM flip-flop 20-319 to a binary ONE. This results in a trap signal being forwarded to CPU 10. By testing the state of the control line of bus 18 to which trap signal CNOMEM000 is applied, CPU 10 can determine that a "no hit fault" condition was detected indicating that the no hit fault circuits are operating properly.

Assuming that testing had proceeded properly, next, CPU 10 issues a cache command having a value of hexadecimal "0080" which resets the "no hit fault mode" flip-flop 20-300 to a binary ZERO state which completes the operation of block 602.

CPU 10 performs the operation of block 604 by issuing a memory read request having a predefined address of 4K − 1. Using the no hit fault mode circuits, CPU 10 can determine whether the size of the cache unit 20 is 2K or 4 K. Since cache 20 has a size of 4K, no trap signal should be received by CPU 10.

As seen from FIG. 6, CPU 10 next begins the operations of block 610. This verifies the operation of the directory parity check circuits and degradation control circuits of blocks 20-860 and 20-880 of FIG. 3c. This is carried out in the manner described in copending related patent application entitled "Directory Test Error Mode Control Apparatus", referenced herein.

Upon completing block 612, CPU 10 begins the operations of block 612. The initialize test verifies that cache unit 20 can be initialized with all four levels active, either two of the four levels active or initialized to the same state in which it was previously. In accordance with the invention, CPU 10 causes a series of cache commands to be transferred to cache unit 20. Each of these commands have bit 12 set to a binary ONE which causes cache unit 20 to perform an initialize operation.

More importantly, bit 1 of each cache command is set to a binary ONE. This enables the states of the cache active levels to be set according to the states of bits 2 and 3. More specifically, when bits 2 and 3 are both binary ZEROS, bus data signals BSDT02210 and BSDT03210 cause both mode flip-flops 20-892 and 20-894 to be switched or reset to binary ZEROS. In this instance, the cache unit 20 operates in normal mode wherein all four levels are active. During initialization, the contents of the first hexadecimal "1000" (i.e., 4096) word locations in main store 12 are loaded into cache unit 20.

However, when bit 2 is a binary ZERO and bit 3 is a binary ONE, bus data signal BSDT02210 causes flip-flop 20-892 to be switched or reset to a binary ZERO while signal BSDT03210 causes flip-flop 20-894 to switch to a binary ONE. IN this instance, cache unit 20 operates in a first partially degraded mode wherein levels 0 and 1 are active while levels 2 and 3 are switched off-line. During initialization, the contents of the first 2048 word locations in main store 12 are loaded into levels 0 and 1 of cache unit 20. The round robin counter section 20-80 is set to replace level 0 contents when CPU 10 causes cache unit 20 to initiate a replacement cycle of operation. The contents of levels 2 and 3 remain unchanged.

When bit 2 is a binary ONE and bit 3 is a binary ZERO, bus data signal BSDT02210 switches mode flip-flop 20-892 to a binary ONE while signal BSDT03210 switches mode flip-flop 20-894 to a binary ZERO. In this case, the cache unit 20 operates in a second partially degraded mode wherein levels 0 and 1 are switched off-line while levels 2 and 3 remain active. During initialization, the contents of the first hexadecimal "800" (i.e., 2048) word locations in main store 12 are loaded into levels 2 and 3 of cache unit 20. The round robin counter section 20-80 is set to replace level 2 contents when CPU 10 generates a memory request which causes cache unit 20 to initiate a replacement cycle of operation. It will be noted that the contents of levels 0 and 1 remain unchanged. In the last case, when bits 2 and 3 are both binary ONES, bus data signals BSDT02210 and BSDT03210 cause both mode flip-flops 20-892 and 20-894 to switch to binary ONES. Here, the cache unit 20 has been switched off-line. During initialization, none of the contents of the locations in main store 12 are loaded into the levels of cache unit 20. The contents remain unchanged.

During the initialize test of block 612, CPU 10 verifies that the initialization operation did take place using the no hit fault mode circuits of section 20-3. In greater detail, a sequence of test instructions, hereinafter test code, is moved by CPU 10 into an area of cache store which starts at the location having hexadecimal address "110" (level 0) so that the execution of the test code will not cause any cache replacement cycles to occur. A first RSC instruction in the test code causes CPU 10 to apply a cache command wherein cache unit 20 initializes the caches with all four levels active, or the first two levels (0,1) active, or the second two levels (2,3) active. The second RSC instruction causes CPU 10 to a cache command which forces bus data bit signal BSDT0920 to a binary ONE and bus data bit signal BSDT10210 to a binary ZERO. This sets no hit fault mode flip-flop 20-300 to a binary ONE while at the same time resetting force directory parity error flip-flop 20-320 to a binary ZERO.

Next, a third instruction (e.g. memory to memory move) included in the test code causes CPU 10 to perform a 4K or 2K word read transfer operation wherein successive cache memory read requests are applied to cache unit 20. That is, CPU 10 forces cache request signal CACHRQ010 to a binary ONE while applying successive memory addresses to the address lines of bus 18. If at any time during execution of the instruction, cache unit 20 encounters a memory address (i.e., row address) which is not contained in directory section 20-4, this causes a no hit fault condition which results in the switching of CNOMEM flip-flop 20-319 to a binary ONE.

This, in turn, signals CPU 10 of a non-existent resource which produces a trap condition. This indicates to CPU 10 that the contents of a main store location which should reside in cache memory section 20-4 does not reside there. This enables CPU 10 to determine whether the circuits of section 20-86 are operating properly during normal mode. A further RSC instruction included in the test code causes CPU 10 to apply to cache unit 20 a cache command which has a value hexadecimal "0080". This forces bus data signals BSDT09210 and BSDT10210 to binary ZEROS resetting "no hit fault mode" flip-flop 20-300 and "force directory error mode" flip-flop 20-320 to binary ZEROS.

The above test is repeated for each combination of active levels that the cache can have initialized. When initialization occurs with only two levels active, (i.e., 0, 1 or 2, 3), the contents of main store locations having hexadecimal addresses "0-7FF" are loaded into cache memory section 20-4. When initialization occurs with levels 0, 1 degraded and levels 2, 3 active, then the contents of locations having hexadecimal addresses "0-3FF" are stored in level 2 while the contents of locations having hexadecimal addresses "400-7FF" are stored in level 3. Conversely, when initialization occurs with levels 2, 3 degraded and levels 0, 1, active, the contents of main store locations having hexadecimal addresses "0-3FF" are stored in level 0 while the contents of locations having hexadecimal addresses "400-7FF" are stored in level 3. The test code resides in the first level to be initialized. When initialization occurs with all four levels active, the contents of locations having hexadecimal addresses "0-3FF", "400-7FF", "800-BFF" and "C00-FFF" are stored in levels 0, 1, 2 and 3, respectively. Upon the completion of the initialization test, the CPU 10 begins the standard tests of blocks 616-640 after the cache unit 20 has been properly conditioned (i.e., operation of block 614 performed).

In addition to the above, the test mode apparatus of the present invention may be used for isolating the source of errors. For example, where cache unit 20 detected a directory parity and automatically degraded operation to two levels, CPU 10 could generate cache commands which would reactivate the deactivated levels. At that time, the CPU 10 could direct cache read commands for examining the address contents of the directory section 20-8, as well as the data contents of the failed levels. Also, by directing cache commands specifying the activation of the different sets of levels, CPU 10 is able to verify via the state of the check indicator (i.e., signal DGRADE010) what set of levels were automatically degraded or placed off-line. This permits CPU 10 to determine which levels were placed off-line without having to change the state of cache unit 20.

It will be obvious to those skilled in the art that many changes may be made to the preferred embodiment of the present invention. For example, the number of levels and cache unit organization may be changed. Also, the format of the commands used may be changed.

To prevent undue burdening the description with matter within the ken of those skilled in the art, a block diagram approach has been followed with a detailed functional description of each block and specific identification of the circuits represented (e.g. chip type). The individual engineer is free to select elements and components such as flip-flop circuits, registers, gates, etc. from the individual's own background or available standard references (e.g. Texas Instruments Corporation catalogues).

It will be noted that the formats of the instructions were not disclosed herein since the engineer is free to select alternate types of instructions. For additional background, reference may be made to the handbook titled "Series 60 (Level 6) Models 6/34, 6/36 and 6/43 Level 6 Minicomputer Handbook", published by Honeywell Information Systems Inc., Order Number AS22, Rev. 3, Copyright 1979.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. For use in a system, test mode control apparatus for verifying the operation of a cache unit including cache and directory stores, each organized into the same number of levels of storage locations, and degradation mode control means coupled to said stores and operative in response to errors detected during the process of accessing data stored in said cache storage locations to automatically degrade the operation of said cache unit to those directory and cache store levels which are free from errors, said test mode control apparatus being operatively coupled to a processing unit for receiving cache commands coded to specify the type of operation to be performed by said test mode control apparatus, each cache command including a first field including a number of level bits coded to specify the states of each of said number of levels, said number being greater than one said test mode control apparatus being coupled to said degradation mode control means and to said processing unit, said test mode control apparatus including:

means coupled to said processing unit for applying said number of level bits to said degradation mode control means; and, logic means coupled to said processing unit for receiving each of said cache commands and said logic means being coupled to said degradation mode control means and operative to condition said degradation mode control means to alter said number of levels to conform to said states of said number of level bits in response to said cache commands.

2. The system of claim 1 wherein said degradation mode control means includes a plurality of bistable elements, each for controlling a predetermined number of said number of levels, each of said plurality of bistable elements being coupled for receiving a different one of said number of level bits and said each of said bistable elements being coupled to said logic means, said logic means being operative in response to each cache command to switch each of said bistable elements to the state specified by said different one of said number of level bits.

3. The system of claim 2 wherein said different one of said number of level bits when in a first state switches said each bistable element to said first state for enabling access to said storage locations within said predetermined number of levels and said different one of said number of level bits when in a second state switching said each bistable element to said second state inhibiting access to said storage locations within said predetermined number of levels.

4. The system of claim 3 wherein said number of levels includes levels 0, 1, 2 and 3 and said predetermined number of levels equals at least two, said plurality of bistable elements corresponding in number to said predetermined number of levels, said plurality of bistable elements when switched to said first state in response to said number of level bits being operative to condition said cache unit to operate in a normal mode of operation.

5. The system of claim 4 wherein one of said plurality of bistable elements when switched to said second state conditions said cache unit to operate in a partially degraded mode of operation.

6. The system of claim 4 wherein said plurality of bistable elements when switched to said second state conditions said cache unit to operate in complete degraded mode of operation.

7. The system of claim 4 wherein said number of level bits is two and said levels 0 through 3 are set to active and inactive states according to the states of said level bits as follows:

| Level Bit Binary Value | Status of Levels |
| --- | --- |
| 00 | levels 0-3 active |
| 01 | levels 0, 1 active and levels 2, 3 inactive |
| 10 | levels 0, 1 inactive and levels 2, 3 active |
| 11 | levels 0-3 inactive. |

8. The system of claim 1 wherein each of said commands includes a second field coded for specifying when said cache unit is to perform an initialization operation, said system further includes a main store coupled to said cache unit and to said processing unit, said main store including a plurality of storage locations, a first group of said plurality of storage locations including instructions of an initialize test routine and said test mode control apparatus further including circuit means for receiving said second field for enabling those levels of said cache and directory stores previously specified by said level bits to be loaded with said instructions and addresses, respectively, obtained from and used to address said first group of main store locations placing said levels of said cache unit in a known state for verifying that only those levels specified by said cache commands were properly initialized to said known state.

9. The system of claim 8 wherein each of said cache commands further includes a third field coded to specify when a no hit fault condition is detectable by said cache unit, said test mode control means further including no hit fault mode means coupled to receive said third field and to said processing unit, said bistable no hit fault mode means when switched to a first state by said third field placing said cache unit in said no hit fault mode of operation and wherein said processing unit is operative in response to one of said instructions of said initialize test routine to generate successive memory read requests to said cache unit specifying the transfer of the contents of cache store locations of only those levels previously initialized and said no hit fault means when in said first state being operative to signal said processing unit when said directory store does not contain the address specified by one of said cache memory read requests indicative of a fault condition within said degradation mode control means.

10. The system of claim 8 wherein said cache unit further includes round robin replacement circuit means coupled to said directory store and to said degradation mode control means, said replacement circuit means designating which one of said number of levels into which data is to be written, said replacement circuit means enabling the contents of only a first portion of said group of main store locations to be written into those levels specified by said level bits when set to a predetermined value specifying a partially degraded mode, and said replacement circuit means being conditioned by said degradation mode control means at the completion of said initialization operation, to designate a predetermined one of the levels specified by said level bits as said next level into which data is to be replaced.

11. The system of claim 10 wherein said number of levels is four wherein said levels are designated as 0, 1, 2 and 3, said predetermined value designating that only levels 0 and 1 are to be initialized to said known state and that levels 2 and 3 are to remain unchanged, said replacement circuit means at said completion of said initialization operation designating level 0 as said next level.

12. The system of claim 10 wherein said number of levels is four and are designated as 0, 1, 2 and 3, said predetermined value being selected for designating that only levels 2 and 3 are to be initialized and that levels 0 and 1 remain unchanged, said replacement circuit means at said completion of said initialization operation designating level 2 as said next level.

13. The system of claim 10 wherein said number of levels is four and are designated as 0, 1, 2 and 3, said predetermined value being selected for designating that levels 0 through 4 are to be initialized, said replacement circuit means designating level 0 as said next level.

14. The system of claim 10 wherein said number of levels is four and are designated as 0, 1, 2 and 3, said predetermined value being selected for designating that none of said levels are to be initialized placing said cache unit in a mode of operation wherein reading and writing of said main store directly without involvement of said cache unit.

15. An automatically degradable cache unit being coupled to a bus for receiving memory requests including row and column addresses from a processing unit for enabling high speed access to main memory data fetched by said cache unit, said cache unit comprising cache and directory stores, each being organized into n number of levels of word locations, each word location within said levels of said stores being defined by a different one of said column addresses and each word location in said directory store for storing a row address designating in which one of said levels of said cache store a corresponding one of said words is stored, addressable random access memory replacement circuit means having a number of multibit locations, each location for storing n level assignment bits for each nth power of 2 number of levels for each of said column addresses designating a next one of said levels for said column address into which replacement information is to be written, error detection means coupled to said directory store levels, said detection means being operative to generate directory error signals for indicating errors in directory store row addresses being accessed from said directory store and mode control means being coupled to said error detection means and to said replacement circuit means, said mode control means being operative in response to said error signals detected in accessing a word stored in one of said cache store levels to switch said cache unit to a degraded mode of operation, altering said n level assignment bits read from said addressable replacement circuit means so as to limit operation to n-k number of cache levels wherein k is a whole integer corresponding to the number of levels by which the storage capacity of said cache is decreased, test mode apparatus for verifying the operation of said cache unit in response to commands from said processing unit, each command including a first field including a number of level bits coded to specify the states of each of said number of levels, said test mode apparatus being coupled to said mode control means and to said processing unit, said test mode apparatus including:
  means coupled to said processing unit for applying said number of level bits to said mode control means; and,
  logic means coupled to said processing unit for receiving each of said cache commands and said logic means being coupled to said mode control means and operative to condition said mode control means to alter said n number of said cache levels according to said states of said number of level bits in response to said commands.

16. The system of claim 15 wherein said mode control means includes a plurality of bistable elements, each for controlling k number of levels, each of said plurality of bistable elements being coupled for receiving a different one of said number of level bits and said each of said bistable elements being coupled to said logic means, said logic means being operative in response to said each command to switch each of said bistable elements to the state specified by said different one of said number of level bits.

17. The system of claim 16 wherein said different one of said number of level bits when in a first state switches said each bistable element to said first state for enabling access to said storage locations within said k number of levels and said different one of said number of level bits when in a second state switching said each bistable element to said second state inhibiting access to said storage locations within said k number of levels.

18. The system of claim 17 wherein said n number of levels is four includes levels 0, 1, 2 and 3 and said k number of levels equals at least two, said plurality of bistable elements corresponding in number to said predetermined number of levels, said plurality of bistable elements when switched to said first state in response to said number of level bits being operative to condition said cache unit to operate in a normal mode of operation.

19. The system of claim 18 wherein one of said plurality of bistable elements when switched to said second state conditions said cache unit to operate in a partially degraded mode of operation limiting access to said n-k number of cache levels.

20. The system of claim 18 wherein said plurality of bistable elements when switched to said second state conditions said cache unit to operate in completely degraded mode of operation limiting access to n−2k number of cache levels.

21. The system of claim 15 wherein each of said commands includes a second field coded for specifying when said cache unit is to perform an initialization operation, said system further including a main store coupled to said cache unit and to said processing unit, said main store including a plurality of storage locations, a first group of said plurality of storage locations including instructions of an initialize routine and said test mode apparatus further including circuit means for receiving said second field for enabling those levels of said cache and directory stores previously specified by said level bits to be loaded with said instructions and addresses, respectively, obtained from and used to address said first group of main store locations placing said levels of said cache unit in a known state for verifying that only those levels specified by said commands were properly initialized to said known state.

22. The system of claim 21 wherein each of said commands further includes a third field coded to specify when a no hit fault condition is detectable by said cache unit, said test mode means further including no hit fault mode means coupled to receive said third field and to said processing means, said bistable no hit fault mode means being switched to a first state as specified by said third field placing said cache unit in said no hit fault mode of operation and wherein said processing unit is operative in response to one of said instructions of said initialize test routine to generate successive memory read requests to said cache unit specifying the transfer of the contents of cache store locations of only those of said n number of levels previously initialized and said no hit fault means when in said first state being operative to signal said processing unit when said directory store does not contain the address specified by one of said cache memory read requests indicative of a fault condition within said mode control means.

23. The system of claim 21 wherein said replacement circuit means enables the contents of only a portion of said group of main store locations to be stored in said n−k levels specified by said level bits when set to a predetermined value specifying a partially degraded mode and, said replacement circuit means being conditioned by said mode control means at the completion of said initialization operation to designate a predetermined one of said n−k levels specified by said level bits as said next level.

24. The system of claim 23 wherein said n number of levels is four wherein said levels are designated as 0, 1, 2 and 3, said predetermined value designating that only levels 0 and 1 are to be initialized to said known state and that levels 2 and 3 are to remain unchanged, said replacement circuit means at said completion of said initialization operation designating level 0 as said next level.

25. The system of claim 23 wherein said n number of levels is four and are designated as 0, 1, 2 and 3, said predetermined value selected for designating that only levels 2 and 3 are to be initialized and tat levels 0 and 1 remain unchanged, said replacement circuit means at said completion of said initialization operation designating level 2 as said next level for replacement.

26. The system of claim 23 wherein said number of levels is four and are designated as 0, 1, 2 and 3, said predetermined value being selected for designating that levels 0 through 4 are to be initialized, said replacement circuit means designating level 0 as said next level.

27. The system of claim 23 wherein said n number of levels is four and are designated as 0, 1, 2 and 3, said predetermined value selected for designating that none of said levels are to be initialized placing said cache unit in a no hit mode of operation.

28. A method for testing the operation of a degradable multilevel cache unit by test mode control apparatus, said cache unit including cache and directory stores, each organized into the same number of levels of storage locations, and degradation mode control apparatus coupled to said stores and operative in response to errors detected during the process of accessing data stored in said cache storage locations to degrade automatically the operation of said multilevel cache unit to those directory and cache store levels which are free from errors, said test mode control apparatus being operatively coupled to a processing unit for receiving cache commands coded to specify the type of operation to be performed by said test mode apparatus, each cache command including a first field including a number of level bits coded to specify the states of each of said number of levels, said test mode control apparatus being coupled to said degradation mode control apparatus and to said processing unit, said method comprising the steps of:

generating a cache command having said first field whose number of level bits are set to predetermined states;

applying said number of level bits to said degradation mode control apparatus by said test mode apparatus; and, enabling said degradation mode control means by logic means included in said test mode control apparatus to alter the states of said cache levels to conform to said predetermined states of said number of level bits for enabling the operation of said degradable cache unit and isolation of faults within said degradation mode control apparatus.

29. The method of claim 28 wherein said method for testing further includes the steps of:

generating another command following said enabling step which includes a second field coded to specify an initialization operation for initializing to known states the active levels of said cache unit specified by said predetermined states of said number of level bits; and, generating a succession of read requests to said cache unit for verifying that only said active levels have been initialized to said known states in response to said another command.

* * * * *